(12) United States Patent
Tahara et al.

(10) Patent No.: US 10,074,800 B2
(45) Date of Patent: Sep. 11, 2018

(54) METHOD FOR ETCHING MAGNETIC LAYER INCLUDING ISOPROPYL ALCOHOL AND CARBON DIOXIDE

(71) Applicant: TOKYO ELECTRON LIMITED, Tokyo (JP)

(72) Inventors: Shigeru Tahara, Miyagi (JP); Eiichi Nishimura, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/557,431

(22) PCT Filed: Mar. 1, 2016

(86) PCT No.: PCT/JP2016/056164
§ 371 (c)(1),
(2) Date: Sep. 11, 2017

(87) PCT Pub. No.: WO2016/143594
PCT Pub. Date: Sep. 15, 2016

(65) Prior Publication Data
US 2018/0033958 A1    Feb. 1, 2018

(30) Foreign Application Priority Data

Mar. 12, 2015    (JP) ................. 2015-049022

(51) Int. Cl.
*H01L 43/12*    (2006.01)
*H01L 21/3065*    (2006.01)
(Continued)

(52) U.S. Cl.
CPC .......... *H01L 43/12* (2013.01); *H01L 21/3065* (2013.01); *H01L 21/67069* (2013.01);
(Continued)

(58) Field of Classification Search
CPC ..... H01L 43/12; H01L 43/08; H01L 21/6833; H01L 21/67069; H01L 43/02
See application file for complete search history.

(56) References Cited

U.S. PATENT DOCUMENTS

2006/0180572 A1*   8/2006   Jacobson .............. B08B 7/0021
                                                          216/83
2009/0314740 A1   12/2009   Ikemoto et al.

FOREIGN PATENT DOCUMENTS

JP    2005-042143 A    2/2005
JP    4354519 B2    10/2009
(Continued)

OTHER PUBLICATIONS

International Search Report issued in PCT/JP2016/056164; dated Apr. 19, 2016.

*Primary Examiner* — John P Dulka
(74) *Attorney, Agent, or Firm* — Studebaker & Brackett PC

(57) ABSTRACT

A method of an embodiment includes: mounting a workpiece, which includes the magnetic layer, on an electrostatic chuck provided in a processing container of a plasma processing apparatus; and etching the magnetic layer to generate plasma of a processing gas including isopropyl alcohol and carbon dioxide in the processing container. In an embodiment, a pressure of a space in the processing container is set to be 1.333 Pa or less, a temperature of the electrostatic chuck is set to be −15° C. or lower, and a partial pressure of isopropyl alcohol is set to be equal to or lower than a saturation vapor pressure of the isopropyl alcohol.

6 Claims, 19 Drawing Sheets

(51) Int. Cl.
*H01L 43/08* (2006.01)
*H01L 27/105* (2006.01)
*H01L 21/67* (2006.01)
*H01L 21/683* (2006.01)
*H01L 43/02* (2006.01)

(52) U.S. Cl.
CPC ........ *H01L 21/6833* (2013.01); *H01L 27/105* (2013.01); *H01L 43/02* (2013.01); *H01L 43/08* (2013.01)

(56) References Cited

FOREIGN PATENT DOCUMENTS

| | | |
|---|---|---|
| JP | 2011-014679 A | 1/2011 |
| JP | 2012-142398 A | 7/2012 |

\* cited by examiner

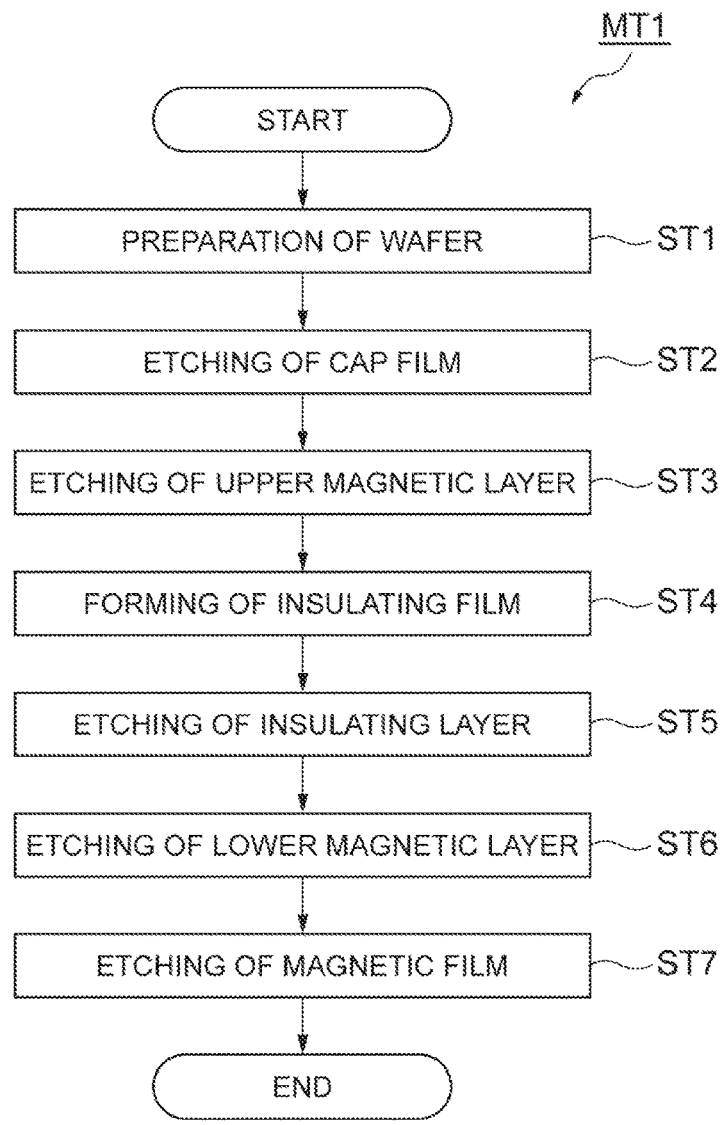

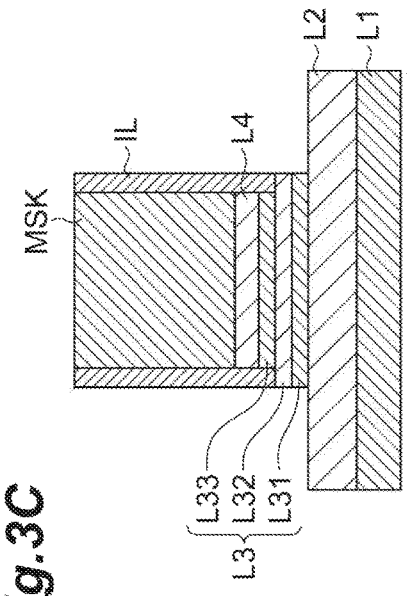
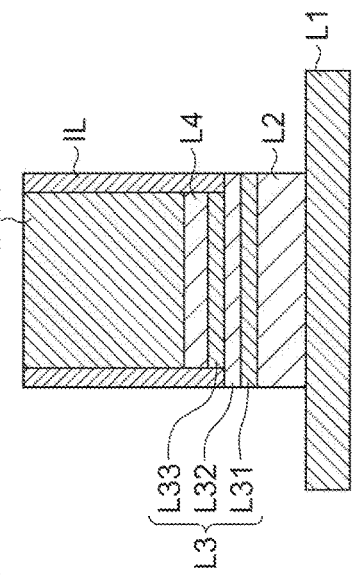
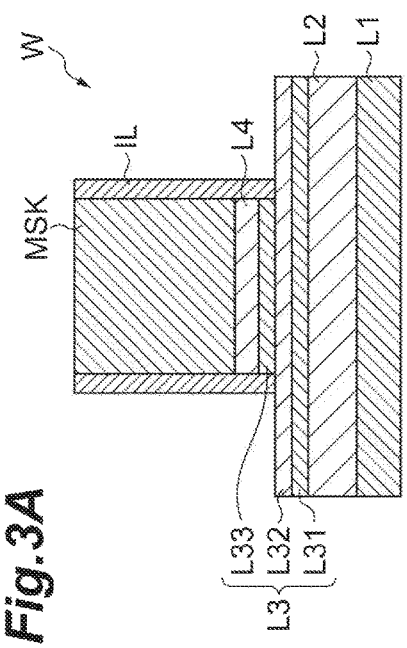
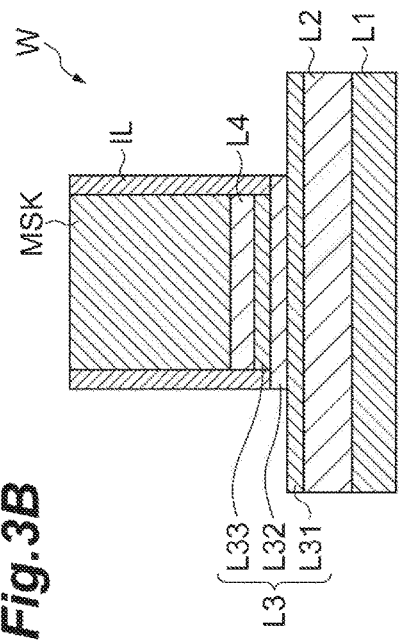

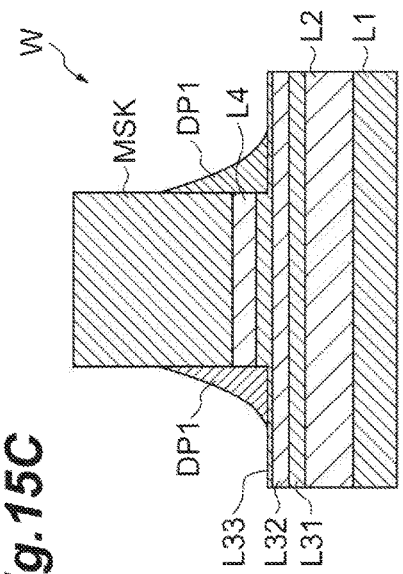
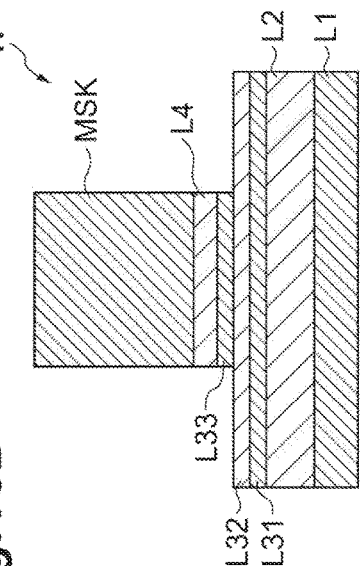
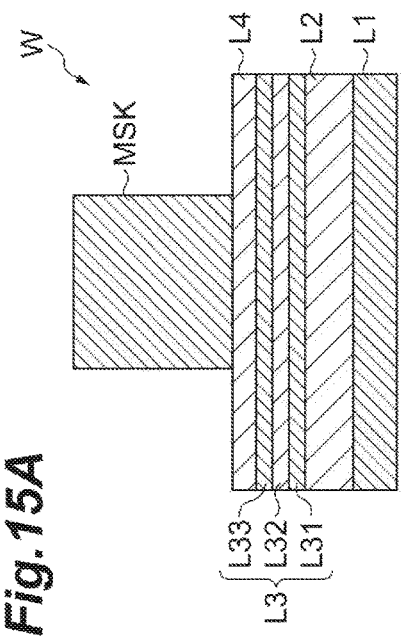
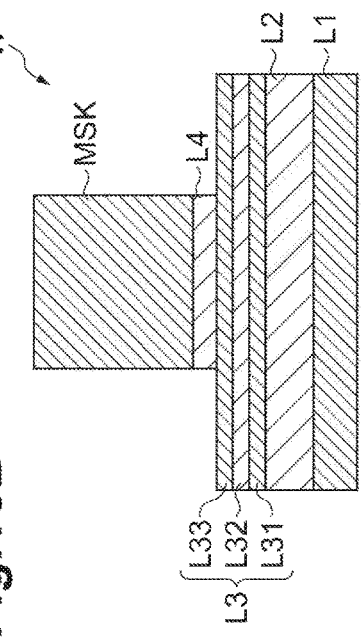

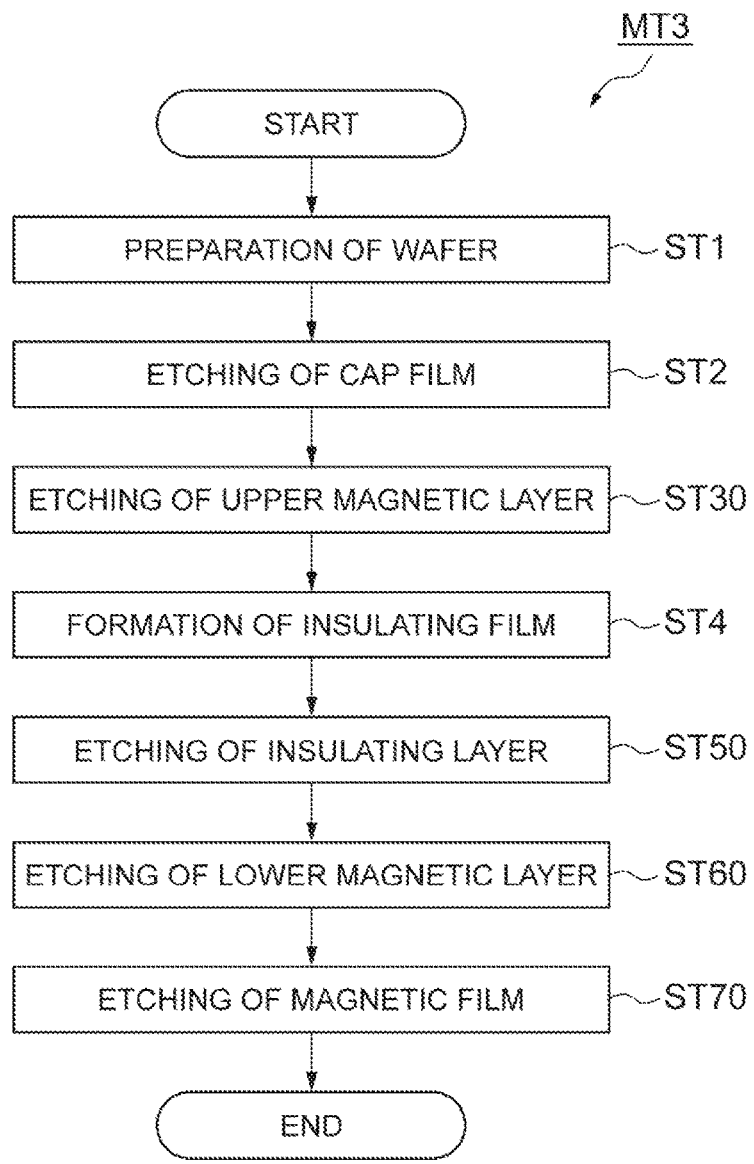

METHOD FOR ETCHING MAGNETIC LAYER INCLUDING ISOPROPYL ALCOHOL AND CARBON DIOXIDE

TECHNICAL FIELD

The present invention relates to a method for etching a magnetic layer.

BACKGROUND ART

In manufacture of an electronic device, plasma etching is typically used for vertical anisotropic etching with respect to an etching target layer of a workpiece. The plasma etching is also used for etching of a magnetic layer included in a magnetic random access memory (MRAM), that is, a layer that is formed from a magnetic material. The magnetic material is a material that is hardly etched, and various researches have been made with respect to a processing gas for the plasma etching of the magnetic material. For example, Japanese Patent Application Laid-Open Publication No. 2005-42143 discloses plasma etching of a magnetic layer by using a processing gas that contains alcohol. Specifically, Japanese Patent Application Laid-Open Publication No. 2005-42143 discloses plasma etching of the magnetic layer by using a processing gas that contains isopropyl alcohol.

In the plasma etching of the magnetic layer by using the processing gas that contains isopropyl alcohol, a deposit including carbon that is derived from isopropyl alcohol excessively adheres to a surface of a workpiece, which inhibits vertical anisotropy in etching of the magnetic layer. Therefore, Japanese Patent Application Laid-Open Publication No. 2005-42143 discloses a configuration in which a gas such as an oxygen gas and $H_2O$ which include an oxygen atom is added to the processing gas to remove the deposit.

CITATION LIST

Patent Literature

[Patent Literature 1] Japanese Patent Application Laid-Open Publication No. 2005-42143

SUMMARY OF INVENTION

Technical Problem

When the oxygen gas is added to the processing gas to remove the deposit that adheres to the surface of the workpiece, the deposit is removed, but active species of oxygen oxidize the magnetic material. As a result, magnetic characteristics deteriorate. Since a lower explosive limit of isopropyl alcohol is 2%, it is necessary to dilute isopropyl alcohol with a large amount of inert gas to secure safety in an exhaust gas line when oxygen is added to the processing gas. However, a concentration of an etchant is reduced due to the dilution of isopropyl alcohol with the large amount of inert gas, and thus it is difficult to obtain a satisfactory etching result.

It is also conceivable to add $H_2O$ to the processing gas, instead of the oxygen gas. However, when $H_2O$ is added to the processing gas, damage is applied to a layer having deliquescency with respect to $H_2O$, such as a tunnel barrier layer that is included in the MRAM. As described above, an effective method for etching the magnetic layer by using the processing gas that contains isopropyl alcohol is not currently present. Accordingly, it is conceivable to use a processing gas that contains methanol, instead of isopropyl alcohol.

However, in the plasma etching of the magnetic layer, it is necessary (i) to allow an etchant, that is, an etchant gas and/or a decomposed product thereof to be sufficiently adsorbed to the surface of the magnetic layer, (ii) to convert the magnetic material into a material (reaction product) that is easy to vaporize by ion energy, and (iii) to vaporize the reaction product. To satisfy the requirement (i) among the three requirements, it is necessary to increase an adsorption coverage factor of the etchant. The adsorption coverage factor represents a ratio of an area that is covered with the etchant through adsorption in the surface of the magnetic layer. When a partial pressure of the etchant is equal to or less than a saturation vapor pressure, and as the partial pressure is closer to the saturation vapor pressure, the adsorption coverage factor increases. On the other hand, to satisfy the requirement (iii), that is, to vaporize the reaction product, it is necessary to execute the plasma etching under low-pressure conditions.

Therefore, in the plasma etching of the magnetic layer, it is necessary to improve the adsorption coverage factor of the etchant under the low-pressure conditions. That is, it is necessary to perform the plasma etching of the magnetic layer under the low-pressure conditions by using an etchant gas having a low saturation vapor pressure. Accordingly, it is effective to satisfy the requirements (i) and (iii) by using isopropyl alcohol having a low saturation vapor pressure instead of methanol having a high saturation vapor pressure. However, in the method for etching the magnetic layer by using isopropyl alcohol, there is a problem such as a damage of the magnetic layer due to oxidation, as described above.

From the background, in the etching of the magnetic layer by using the processing gas that contains isopropyl alcohol, it is necessary to remove a deposit that contain carbon, and it is necessary to suppress a damage of the magnetic layer due to oxidation.

Solution to Problem

According to an aspect of the invention, there is provided a method for etching a magnetic layer. The method includes: (a) a step of mounting a workpiece, which includes the magnetic layer, on an electrostatic chuck provided in a processing container of a plasma processing apparatus; and (b) a step of etching the magnetic layer, wherein plasma of a processing gas including isopropyl alcohol and carbon dioxide is generated in the processing container.

In the method, since the isopropyl alcohol is included in the processing gas, a high adsorption coverage factor of the isopropyl alcohol and a decomposed product thereof, that is, an etchant with respect to the magnetic layer is obtained even at a low pressure. It is also possible to evaporate a reaction product at a low pressure. In addition, in plasma of carbon dioxide included in the processing gas, a generation amount of active species of oxygen is small, but the plasma has a high ashing rate. Therefore, according to the method, in etching of a magnetic layer by using a processing gas that includes isopropyl alcohol, it is possible to remove a deposit that contains carbon, and it is possible to suppress a damage of the magnetic layer due to oxidation.

In the step of etching the magnetic layer according to an embodiment, a pressure of a space in the processing container may be set to be 1.333 Pa or less, a temperature of the electrostatic chuck may be set to a temperature of −15° C. or lower, and a partial pressure of the isopropyl alcohol in the processing gas may be set to be equal to or lower than a saturation vapor pressure of the isopropyl alcohol at the temperature of the electrostatic chuck. In the step of etching the magnetic layer according to an embodiment, the partial pressure of the isopropyl alcohol may be set to be equal to or lower than a saturation vapor pressure of the isopropyl alcohol, and be equal to or greater than 2% of the saturation vapor pressure. In the step of etching the magnetic layer according to an embodiment, the temperature of the electrostatic chuck may be set to be not higher than −15° C. and not lower than −50° C. According to the embodiments, it is possible to further efficiently realize a high adsorption coverage factor of the etchant and vaporization of the reaction product.

According to an embodiment, the workpiece may include an underlying layer, a magnetic film provided on the underlying layer, and a magnetic tunnel junction layer including a lower magnetic layer, a tunnel barrier layer, and an upper magnetic layer, the magnetic tunnel junction layer being provided on the magnetic film. In the step of etching the magnetic layer according to the embodiment, the magnetic film and the magnetic tunnel junction layer may be etched as the magnetic layer.

According to an embodiment, the plasma processing apparatus may include a support structure including the electrostatic chuck, the support structure may be configured to rotate the electrostatic chuck around a central axis of the electrostatic chuck, and may be configured to rotate around a tilt axis perpendicular to the central axis. The step of etching the magnetic layer according to the embodiment includes a step of generating the plasma with the workpiece being supported horizontally with respect to a vertical direction, and a step of generating the plasma with the workpiece being tilted with respect to the vertical direction, and with the workpiece being rotated. When the etching of the magnetic layer is performed in a state in which the workpiece is horizontally supported, a reaction product adheres to a side surface of a feature that is formed by the etching. When the plasma is generated in a state in which the workpiece is tilted with respect to the vertical direction, and the workpiece is rotated, active species from the plasma can be incident to the whole region of the side surface of the feature that is formed by the etching. In addition, the incidence of the active species can be performed uniformly in a plane of the workpiece. Therefore, according to the embodiment, in the entire region of the side surface of the feature that is formed by the etching, it is possible to remove a deposit that adheres to the side surface, and it is possible to enhance verticality of the feature. The removal of the deposit can be performed uniformly in a plane of the workpiece, and thus in-plane uniformity of the feature formed by the etching is improved.

Advantageous Effects of Invention

As described above, in the etching of the magnetic layer by using the processing gas that contains isopropyl alcohol, it is possible to remove a deposit that contains carbon, and it is possible to suppress a damage of the magnetic layer due to oxidation.

BRIEF DESCRIPTION OF DRAWINGS

FIG. 1 is a flowchart illustrating an etching method according to a first embodiment.

FIGS. 3A, 3B, 3C and 3D are cross-sectional views illustrating products obtained by respective steps of the method MT1 according to the first embodiment.

FIG. 15A is a cross-sectional view illustrating a workpiece according to the second embodiment, and FIGS. 15B, 15C and 15D are cross-sectional views illustrating products obtained by respective steps of a method MT2 according to the second embodiment.

FIG. 19 is a flowchart illustrating an etching method according to a third embodiment.

DESCRIPTION OF EMBODIMENTS

Figure 2A:
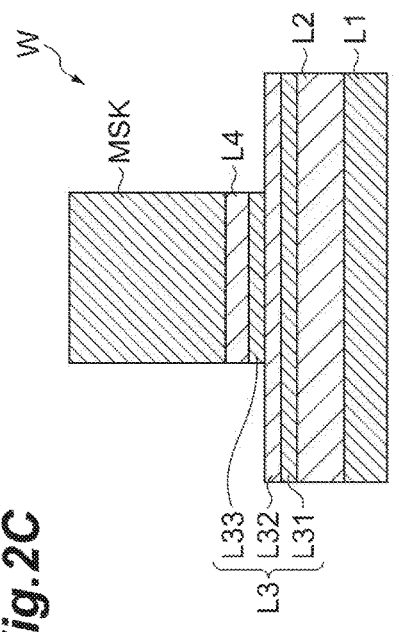
FIG. 2A is a cross-sectional view illustrating a workpiece to which the etching method shown in FIG. 1 is applicable.

Hereinafter, various embodiments will be described in detail with reference to the drawings. In the drawings, identical or corresponding parts are denoted by the same reference symbols.

First Embodiment

FIG. 1 is a flowchart illustrating an etching method according to a first embodiment. A method MT1 shown in FIG. 1 is a method for etching a magnetic material through plasma processing with respect to a workpiece.

FIG. 2A is a cross-sectional view illustrating a workpiece to which the etching method shown in FIG. 1 is applicable. FIGS. 2B, 2C and 2D and FIGS. 3A, 3B, 3C and 3D are cross-sectional views illustrating products obtained by respective steps of the etching method shown in FIG. 1. The workpiece shown in FIG. 2A includes a layer formed from a magnetic material, and has a form of a wafer W. The wafer W includes a multi-layer film that configures an MRAM device. Specifically, the wafer W includes an underlying layer L1, a magnetic film L2, a magnetic tunnel junction layer L3 (hereinafter, referred to as "MTJ layer L3"), a cap film L4, and a mask MSK.

For example, the underlying layer L1 can be formed from Ta, Ru, and the like. The magnetic film L2 is provided on the underlying layer L1 and can be formed from CoPt. The MTJ layer L3 is provided on the magnetic film L2, and includes a lower magnetic layer L31, an insulating layer L32 (tunnel barrier layer), and an upper magnetic layer L33. The insulating layer L32 is provided on the lower magnetic layer L31, and the upper magnetic layer L33 is provided on the insulating layer L32. For example, the lower magnetic layer L31 and the upper magnetic layer L33 can be formed from CoFeB. For example, the insulating layer L32 can be formed from MgO. The cap film L4 is provided on the MTJ layer L3, and can be formed, for example, from Ta, Ru, and the like. The mask MSK is provided on the cap film L4. For example, the mask MSK can be formed from TiN.

Figure 4:
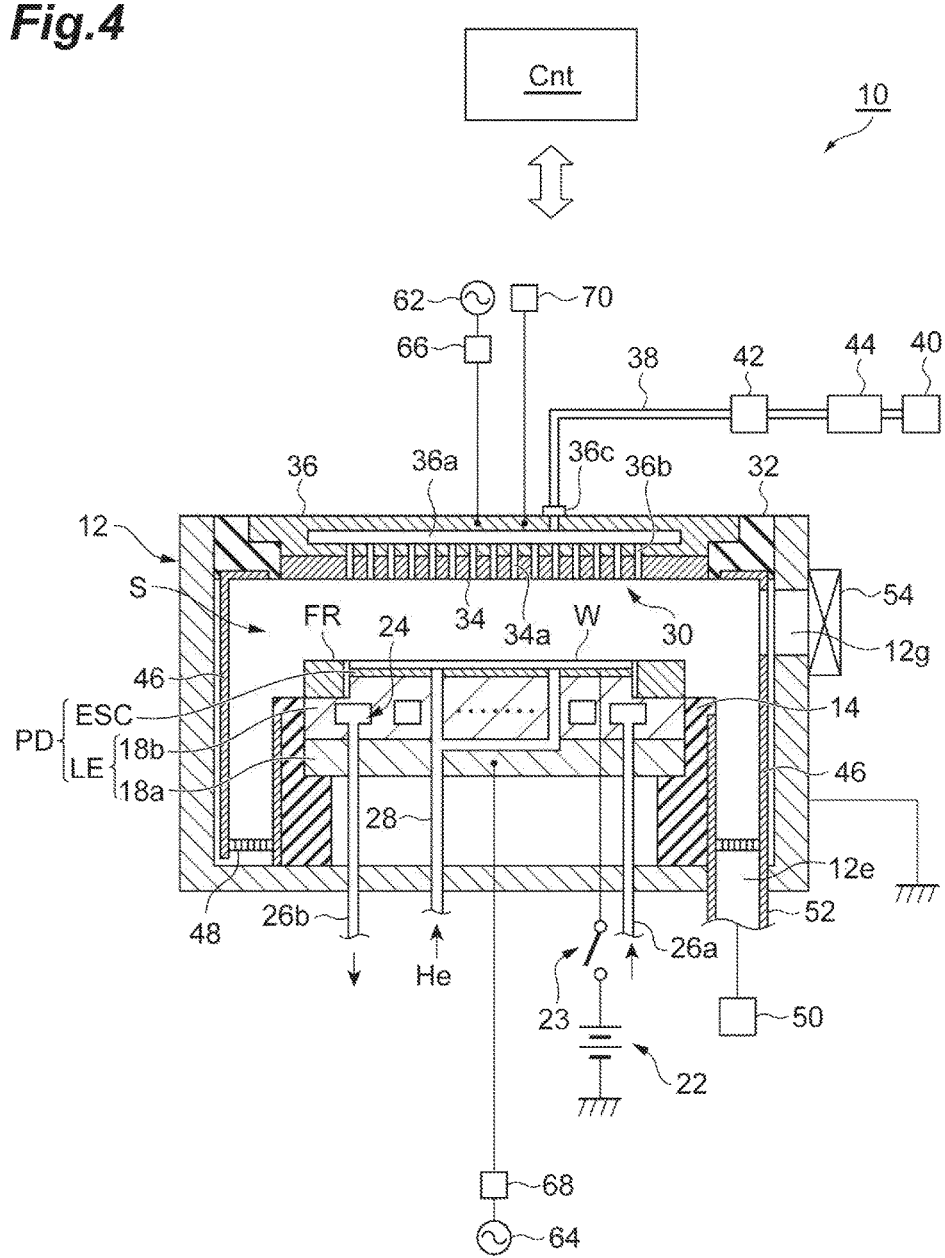
FIG. 4 is a view schematically illustrating an example of a plasma processing apparatus that can be used to carry out the method shown in FIG. 1.

In a method MT1, the wafer W shown in FIG. 2A is processed in a plasma processing apparatus. FIG. 4 is a view schematically illustrating an example of a plasma processing apparatus that can be used to carry out the method shown in FIG. 1. A plasma processing apparatus 10 shown in FIG. 4 is a capacitively coupled plasma etching apparatus, and includes a processing container 12 having a substantially cylindrical shape. For example, an inner wall surface of the processing container 12 is constituted by aluminum subjected to anodic oxidation processing. The processing container 12 is protectively grounded.

A support 14 having a substantially cylindrical shape is provided on the bottom of the processing container 12. For example, the support 14 is formed from an insulating material. The support 14 extends from the bottom of the processing container 12 in a vertical direction in the processing container 12. A support structure PD is provided in the processing container 12. The support structure PD is supported by the support 14.

The support structure PD holds the wafer W on an upper surface thereof. The support structure PD includes a lower electrode LE and an electrostatic chuck ESC. The lower electrode LE includes a first plate 18a and a second plate 18b. For example, the first plate 18a and the second plate 18b are configured by a metal such as aluminum, and have a substantially disc shape. The second plate 18b is provided on the first plate 18a, and is electrically connected to the first plate 18a.

The electrostatic chuck ESC is provided on the second plate 18b. The electrostatic chuck ESC has a structure in which an electrode as a conductive film is disposed between a pair of insulating layers or insulating sheets. A DC power supply 22 is electrically connected to the electrode of the electrostatic chuck ESC via a switch 23. The electrostatic chuck ESC attracts the wafer W by an electrostatic force such as Coulomb's force that is generated by a DC voltage from the DC power supply 22. According to the attraction, the electrostatic chuck ESC can hold the wafer W.

A focus ring FR is provided on a peripheral portion of the second plate 18b to surround an edge of the wafer W and the electrostatic chuck ESC. The focus ring FR is provided to improve etching uniformity. The focus ring FR is constituted by a material that is appropriately selected in accordance with a material of a film to be etched, and may be formed from quartz as an example.

A coolant flow passage 24 is provided in the second plate 18b. The coolant flow passage 24 constitutes a temperature control mechanism. A coolant is supplied to the coolant flow passage 24 from a chiller unit provided outside the processing container 12 through a pipe 26a. The coolant supplied to the coolant flow passage 24 is returned to the chiller unit through a pipe 26b. As described, the coolant circulates between the coolant flow passage 24 and the chiller unit. A temperature of the wafer W held by the electrostatic chuck ESC is controlled by controlling a temperature of the coolant.

The plasma processing apparatus 10 is provided with a gas supply line 28. The gas supply line 28 supplies a heat transfer gas such as a He gas from a heat transfer gas supply mechanism between an upper surface of the electrostatic chuck ESC and a rear surface of the wafer W.

The plasma processing apparatus 10 is provided with an upper electrode 30. The upper electrode 30 is disposed above the support structure PD to face the support structure PD. The lower electrode LE and the upper electrode 30 are provided substantially in parallel to each other. A space S for performing plasma processing with respect to the wafer W is provided between the upper electrode 30 and the lower electrode LE.

The upper electrode 30 is supported to an upper portion of the processing container 12 through an insulating shield member 32. In an embodiment, the upper electrode 30 may be configured in such a manner that a distance from the upper surface of the support structure PD, that is, a distance from a wafer mounting surface in a vertical direction is variable. The upper electrode 30 may include an electrode plate 34 and an electrode support 36. The electrode plate 34 faces the space S, and the electrode plate 34 is provided with a plurality of gas ejection holes 34a. In an embodiment, the electrode plate 34 is formed from silicon.

The electrode support 36 detachably supports the electrode plate 34, and can be formed from a conductive material such as aluminum. The electrode support 36 can have a water cooling structure. A gas diffusion chamber 36a is provided in the electrode support 36. A plurality of gas flow holes 36b, which communicate with the gas ejection holes 34a, downwardly extend from the gas diffusion chamber 36a. A gas introduction port 36c, which guides a processing gas to the gas diffusion chamber 36a, is formed in the electrode support 36, and a gas supply pipe 38 is connected to the gas introduction port 36c.

A gas source group 40 is connected to the gas supply pipe 38 through a valve group 42 and a flow rate controller group 44. The gas source group 40 includes a plurality of gas sources. As an example, the gas source group 40 includes one or more alcohol gas sources, a rare gas source, a nitrogen gas ($N_2$ gas) source, a hydrogen gas ($H_2$ gas) source, and a carbon dioxide ($CO_2$) gas source. As an example, the one or more alcohol gas sources can include a methanol gas source, an ethanol gas source, and a propanol gas source. The propanol gas includes a 1-propanol gas and 2-propanol gas (isopropyl alcohol). The rare gas source may be an arbitrary rare gas source such as a He gas, a Ne gas, an Ar gas, a Kr gas, and a Xe gas, and may be the Ar gas source as an example.

The valve group 42 includes a plurality of valves, and the flow rate controller group 44 includes a plurality of flow rate controllers such as a massflow controller. Each of the plurality of gas sources of the gas source group 40 is connected to the gas supply pipe 38 through a corresponding valve of the valve group 42 and a corresponding flow rate controller of the flow rate controller group 44.

In the plasma processing apparatus 10, a deposition shield 46 is detachably provided along an inner wall of the processing container 12. The deposition shield 46 is also provided to an outer periphery of the support 14. The deposition shield 46 prevents an etching by-product (deposition) from adhering to the processing container 12, and can be configured by coating an aluminum material with ceramics such as $Y_2O_3$.

An exhaust plate 48 is provided on a bottom side of the processing container 12, and between the support part 14 and a side wall of the processing container 12. For example, the exhaust plate 48 can be configured by coating an aluminum material with ceramics such as $Y_2O_3$. An exhaust port 12e is provided on a lower side of the exhaust plate 48 and in the processing container 12. An exhaust device 50 is connected to the exhaust port 12e through an exhaust tube 52. The exhaust device 50 includes a vacuum pump such as a turbomolecular pump, and can evacuate a space inside the processing container 12 to a desired degree of vacuum. A transfer-in/out port 12g of the wafer W is provided in a side wall of the processing container 12, and the transfer-in/out port 12g can be closed and opened by a gate valve 54.

The plasma processing apparatus 10 further includes a first high frequency power supply 62 and a second high frequency power supply 64. The first high frequency power supply 62 is a power supply that generates a high frequency wave for plasma generation, and generates, for example, a high frequency wave having a frequency of 27 to 100 MHz. The first high frequency power supply 62 is connected to the upper electrode 30 through a matching unit 66. The matching unit 66 is a circuit that matches output impedance of the first high frequency power supply 62 and input impedance on a load side (upper electrode 30 side). The first high frequency power supply 62 may be connected to the lower electrode LE through the matching unit 66.

The second high frequency power supply 64 is a power supply that generates a high frequency wave for attraction of ions to the wafer W, that is, a high frequency bias, and generates, for example, a high frequency bias having a frequency in a range of 400 kHz to 13.56 MHz. The second high frequency power supply 64 is connected to the lower electrode LE through a matching unit 68. The matching unit 68 is a circuit that matches output impedance of the second high frequency power supply 64 and input impedance on a load side (lower electrode LE side).

The plasma processing apparatus 10 further includes a power supply 70. The power supply 70 is connected to the upper electrode 30. The power supply 70 applies to the upper electrode 30 a voltage, to attract positive ions present in the space S to the electrode plate 34. In an example, the power supply 70 is a DC power supply that generates a negative DC voltage. In another example, the power supply 70 may be an AC power supply that generates an AC voltage of a relatively low frequency. A voltage, which is applied to the upper electrode from the power supply 70, may be a voltage of −150 V or less. That is, a voltage, which is applied to the upper electrode 30 by the power supply 70, may be a negative voltage having an absolute value of 150 V or greater. When the voltage is applied to the upper electrode 30 from the power supply 70, positive ions in the space S collide with the electrode plate 34, which causes a secondary electron and/or silicon to be emitted from the electrode plate 34.

In an embodiment, the plasma processing apparatus 10 can further include a control unit Cnt. The control unit Cnt is a computer provided with a processor, a storage unit, an input device, a display device, and the like, and controls respective parts of the plasma processing apparatus 10. The control unit Cnt can perform a command input operation and the like in order for an operator to manage the plasma processing apparatus 10 by using the input apparatus, and can visually display an operation situation of the plasma processing apparatus 10 by using the display device. A storage unit of the control unit Cnt stores a control program that is used to control various kinds of processing, which are executed by the plasma processing apparatus 10, by the processor, a program that is used to allow each unit of the plasma processing apparatus 10 to execute processing in correspondence with processing conditions, that is, a processing recipe.

Hereinafter, the method MT1 will be described in detail with reference to FIG. 1.

In the method MT1, first, in a step ST1, the wafer W shown in FIG. 2A is prepared. In the step ST1, the wafer W is transferred in the plasma processing apparatus 10, and the wafer W is mounted on the electrostatic chuck ESC of the support structure PD and is held by the electrostatic chuck ESC.

In the method MT1, a step ST2 is subsequently executed. In the step ST2, plasma of a processing gas is generated in the processing container 12. As an example, plasma of the processing gas including $H_2$ gas is generated with respect to the cap film L4 that is formed from Ru. The processing gas, which is used in the step ST2, may further include an inert gas such as a $N_2$ gas. In the step ST2, a processing gas from a gas source selected from the plurality of gas sources of the gas source group 40 is supplied into the processing container 12, the exhaust device 50 is operated, and a pressure (hereinafter, referred to as "process pressure") inside the processing container 12 is set to a predetermined pressure. The high frequency wave from the first high frequency power supply 62 and the high frequency bias from the second high frequency power supply 64 are respectively supplied to the upper electrode 30 and the lower electrode LE. Accordingly, plasma of the processing gas is generated. An operation of each part of the plasma processing apparatus 10 in the step ST2 can be controlled by the control unit Cnt.

Figure 2B:
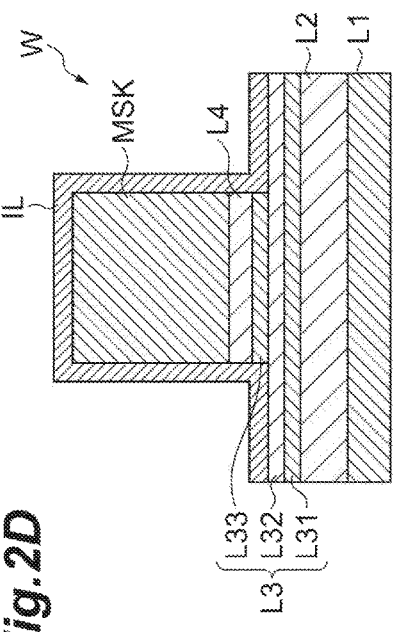
FIGS. 2B, 2C and 2D are cross-sectional views illustrating products obtained by respective steps of the etching method shown in FIG. 1.

In the step ST2, the cap film L4 is etched at a portion exposed from the mask MSK due to active species from plasma, for example, active species of hydrogen. As a result, as shown in FIG. 2B, in the whole region of the cap film L4, a portion exposed from the mask MSK is removed.

In the method MT1, a step ST3 is subsequently executed. The step ST3 is an embodiment of a step of etching a magnetic layer. In the step ST3, the upper magnetic layer L33 of the MTJ layer L3 is etched. In the step ST3, a processing gas that includes isopropyl alcohol and carbon dioxide is supplied into the processing container 12. The processing gas may further include a rare gas such as an Ar gas. In the step ST3, a processing gas from gas sources selected among the plurality of gas sources of the gas source group 40 is supplied into the processing container 12, the exhaust device 50 is operated, and a pressure inside the processing container 12, that is, a process pressure is set to a predetermined pressure. The high frequency wave from the first high frequency power supply 62 and the high frequency bias from the second high frequency power supply 64 are respectively supplied to the upper electrode 30 and the lower electrode LE. Accordingly, plasma of the processing gas is generated. An operation of each part of the plasma processing apparatus 10 in the step ST3 can be controlled by the control unit Cnt.

Figure 2C:
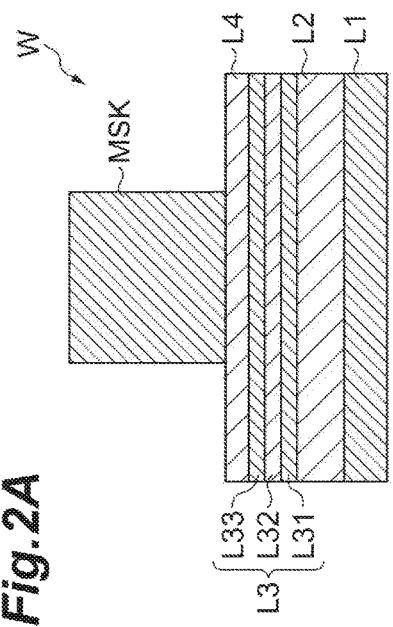

In the step ST3, plasma of the processing gas is generated, and isopropyl alcohol and/or a decomposed product thereof, that is, an etchant adheres to a surface of the upper magnetic layer L33, and thus a reaction between the etchant and a magnetic material that configures the upper magnetic layer L33 is promoted. A reaction product is exhausted. As a result, as shown in FIG. 2C, the upper magnetic layer L33 is etched at a portion exposed from the mask MSK. A deposit that includes carbon derived from isopropyl alcohol is removed by active species of oxygen derived from carbon dioxide.

Figure 2D:
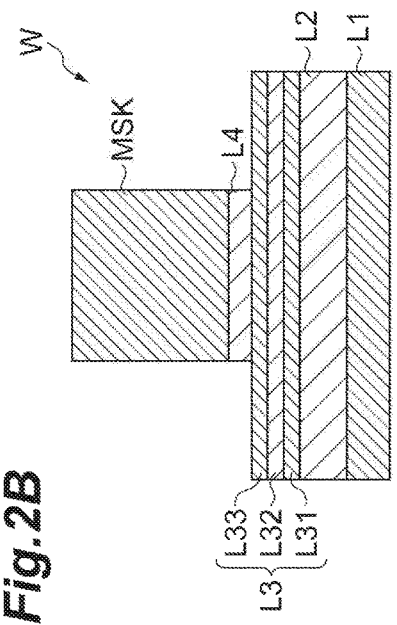

In the method MT1, a step ST4 is subsequently executed. In the step ST4, an insulating film IL is formed. The insulating film IL is formed to prevent conduction between the lower magnetic layer L31 and the upper magnetic layer L33. Specifically, in the step ST4, the wafer W is transferred to a film forming apparatus. In the film forming apparatus, the insulating film IL is formed on a surface of the wafer W as shown in FIG. 2D. For example, the insulating film IL can be formed from silicon nitride or silicon oxide. Next, in the step ST4, the insulating film IL is etched in a region that extends along to an upper surface of the mask MSK and in a region that extends along to an upper surface of the insulating layer L32. In the etching, an arbitrary plasma processing apparatus can be used. For example, the plasma processing apparatus 10 can be used in the etching. In the etching, a processing gas, which includes a hydrofluorocarbon gas or a fluorocarbon gas, can be used. As a result of the etching, as shown in FIG. 3A, the insulating film IL remains along a side surface of the mask MSK, a side surface of the cap film L4, and a side surface of the upper magnetic layer L33.

In the method MT1, a step ST5 is subsequently executed. In the step ST5, the insulating layer L32 of the MTJ layer L3 is etched. An operation and etching conditions of the plasma processing apparatus 10 in the step ST5 may be the same as the operation and etching conditions of the plasma processing apparatus 10 in the step ST3.

In the step ST5, plasma of the processing gas is generated, and isopropyl alcohol and/or a decomposed product thereof, that is, an etchant adheres to a surface of the insulating layer L32, and thus a reaction between the etchant and a material that configures the insulating layer L32 is promoted. A reaction product is exhausted. As a result, as shown in FIG. 3B, the insulating layer L32 is etched at a portion exposed from the mask MSK. A deposit that includes carbon derived from isopropyl alcohol is removed by active species of oxygen derived from carbon dioxide.

In the method MT1, a step ST6 is subsequently executed. The step ST6 is an embodiment of a step of etching a magnetic layer. In the step ST6, the lower magnetic layer L31 of the MTJ layer L3 is etched. An operation and etching conditions of the plasma processing apparatus 10 in the step ST6 may be the same as the operation and etching conditions of the plasma processing apparatus 10 in the step ST3.

In the step ST6, plasma of the processing gas is generated, and isopropyl alcohol and/or a decomposed product thereof, that is, an etchant adheres to a surface of the lower magnetic layer L31, and thus a reaction between the etchant and a magnetic material that configures the lower magnetic layer L31 is promoted. A reaction product is exhausted. As a result, as shown in FIG. 3C, the lower magnetic layer L31 is etched at a portion exposed from the mask MSK. A deposit that includes carbon derived from isopropyl alcohol is removed by active species of oxygen derived from carbon dioxide.

In the method MT1, a step ST7 is subsequently executed. The step ST7 is an embodiment of a step of etching a magnetic layer. In the step ST7, the magnetic film L2 is etched. An operation and etching conditions of the plasma processing apparatus 10 in the step ST7 may be the same as the operation and etching conditions of the plasma processing apparatus 10 in the step ST3.

In the step ST7, plasma of the processing gas is generated, and isopropyl alcohol and/or a decomposed product thereof, that is, an etchant adheres to a surface of the magnetic film L2, and thus a reaction between the etchant and a magnetic material that configures the magnetic film L2 is promoted. A reaction product is exhausted. As a result, as shown in FIG. 3D, the magnetic film L2 is etched at a portion exposed from the mask MSk. A deposit that includes carbon derived from isopropyl alcohol is removed by active species of oxygen derived from carbon dioxide.

Figure 5:
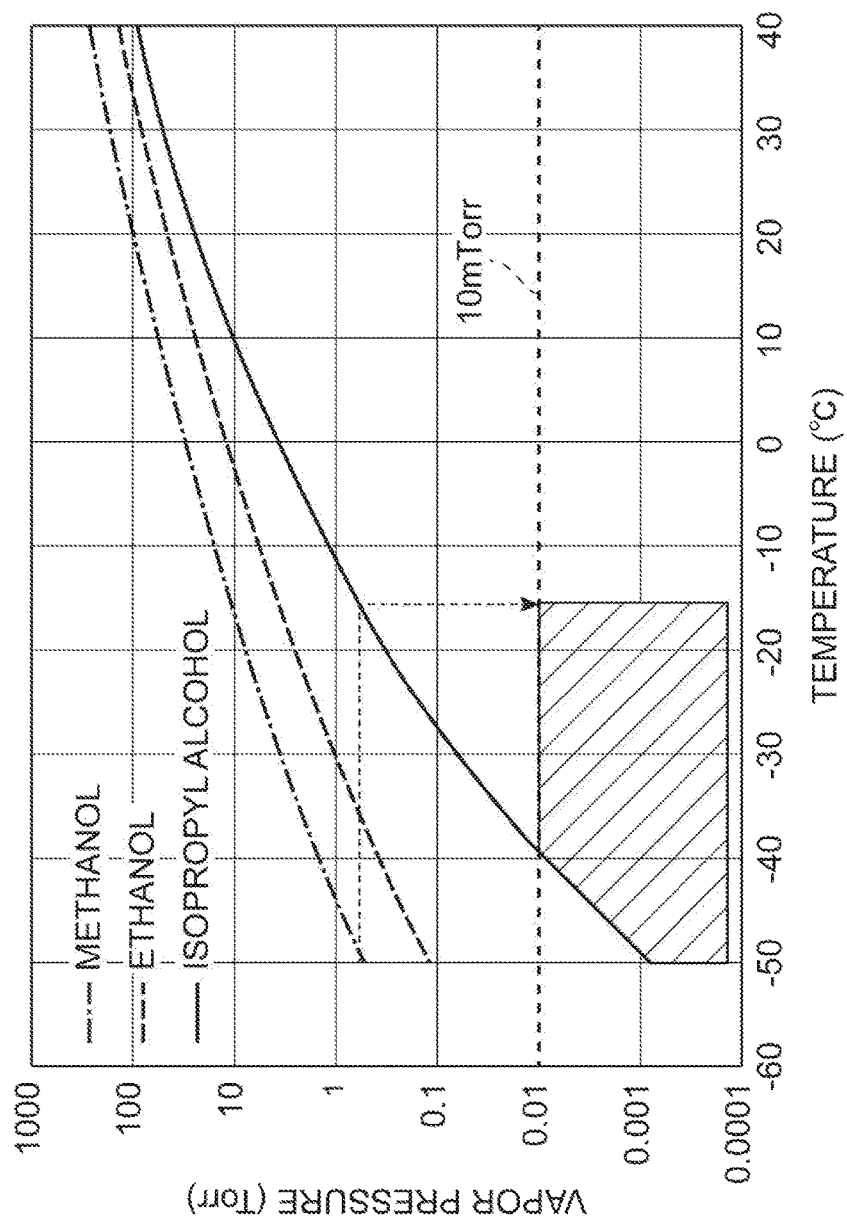
FIG. 5 is a view illustrating a saturation vapor pressure curve of alcohol.

Hereinafter, description will be given of a processing parameter range (hereinafter, referred to as "appropriate processing region") which can be advantageously used in the etching method of the embodiment with reference to FIG. 5. FIG. 5 is a view illustrating a saturation vapor pressure curve of alcohol. In FIG. 5, the horizontal axis represents a temperature and the vertical axis represents a vapor pressure. FIG. 5 illustrates a relationship between a temperature and a saturation vapor pressure for each of methanol, ethanol, and isopropyl alcohol. In FIG. 5, a hatched region with inclined lines is an appropriate processing region.

The step ST3, the step ST6, and the step ST7 in the method MT1 are steps of etching a magnetic layer. In the steps, for example, a processing pressure is set to a pressure of 10 mTorr (1.333 Pa) or less to vaporize a reaction product between an etchant and a magnetic material that configures the magnetic layer, and to exhaust the resultant vaporized reaction product. Accordingly, in the appropriate processing region shown in FIG. 5, an upper limit (refer to a dotted line indicating 10 mTorr in FIG. 5) of the process pressure is set. In the steps, a temperature of the wafer W, that is, a temperature of the electrostatic chuck and a partial pressure of isopropyl alcohol are adjusted to increase an adsorption coverage factor of an etchant with respect to a surface of the magnetic layer at a low processing pressure.

As shown in FIG. 5, when alcohol and a decomposed product thereof, that is, an etchant is supplied at a partial pressure that is equal to or lower than a saturation vapor pressure, and is close to the saturation vapor pressure, a high adsorption coverage factor is obtained. In etching of the magnetic layer by using methanol, when the process pressure is 10 mTorr or lower, and the temperature of the electrostatic chuck is −50° C., an amount of a deposit with respect to a side surface of a formed feature is reduced. As a result, it is possible to enhance verticality of the feature. When the temperature of the electrostatic chuck is raised from −50° C. under a setting in which the process pressure is 10 mTorr or lower, the amount of the deposit tends to increase. It is preferable that the temperature of the electrostatic chuck is high to promote vaporization of a by-product. However, when the temperature of the electrostatic chuck is raised, the amount of the deposit tends to increase. Accordingly, in a gas system using methanol, it is considered that surface adsorption of a raw material gas, that is, methanol becomes a limitation factor, and thus etching of the magnetic layer does not proceed. Since the saturation vapor pressure is approximately 500 mTorr when a temperature methanol is −50° C., it is considered that when a partial pressure is 2% or greater of the saturation vapor pressure, the methanol adheres to a surface of the magnetic layer with a sufficient adsorption coverage factor, in the etching using methanol. However, the saturation vapor pressure of methanol is originally high, and thus, in an embodiment, isopropyl alcohol having a low saturation vapor pressure is used as alcohol that can be included in the processing gas.

As shown in FIG. 5, when isopropyl alcohol is used at a temperature of −15° C. or lower, a partial pressure of 2% of the saturation vapor pressure is accomplished at a process pressure of 10 mTorr or lower, as is the case with a partial pressure at which a sufficient adsorption coverage factor is obtained in a case of methanol. In the step ST3 of an embodiment, as shown by a hatched region in FIG. 5, the process pressure is set to a pressure of 10 mTorr (1.333 Pa) or lower, the temperature of the electrostatic chuck is set to a temperature of −15° C. or lower, and the partial pressure of isopropyl alcohol is set to a partial pressure that is equal to or lower than the saturation vapor pressure of isopropyl alcohol at the temperature of the electrostatic chuck. In the embodiment, the temperature of the electrostatic chuck is set to a temperature of −50° C. or higher. In the embodiment, the partial pressure of isopropyl alcohol is set to a partial pressure of 2% or greater of the saturation vapor pressure of isopropyl alcohol at the temperature of the electrostatic chuck. According to the above-described condition setting, it is possible to obtain a sufficient adsorption coverage factor of the etchant derived from isopropyl alcohol with respect to the magnetic layer, and it is possible to perform etching at a low process pressure. As a result, the etchant is allowed to be sufficiently adsorbed to a surface of the magnetic layer, and it is possible to promote exhaust of a reaction product of the etchant and a magnetic material that configures the magnetic layer. Hence, the vertical anisotropy in etching of the magnetic layer is improved.

Figure 6B:
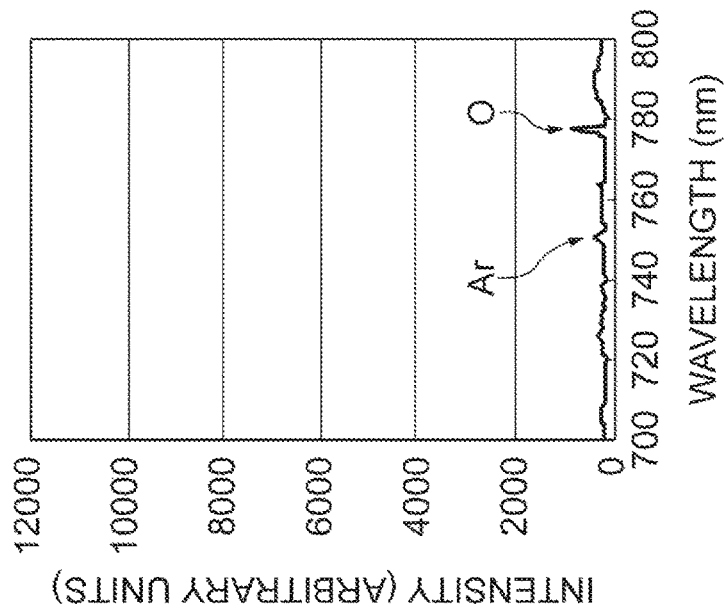
FIGS. 6A and 6B are views illustrating results of optical emission spectroscopy for plasma of carbon dioxide and plasma of an oxygen gas.
Figure 6A:
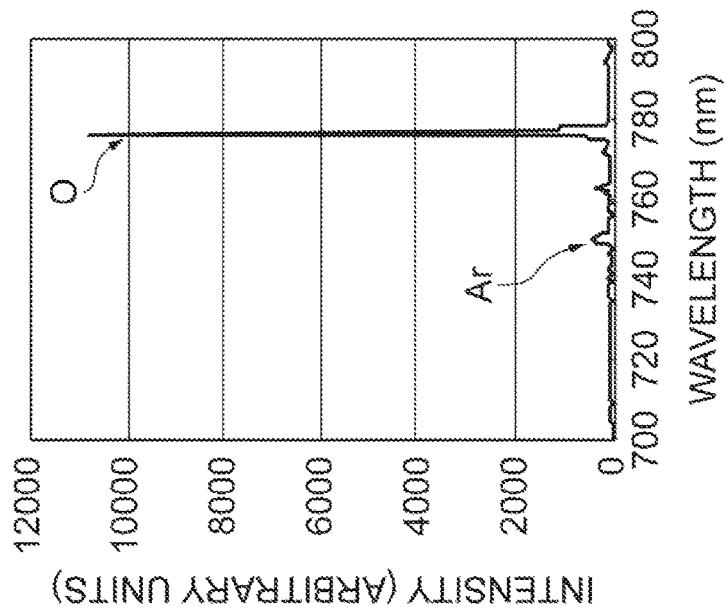

In the step ST3, the step ST6, and the step ST7 in the method MT1, a gas including isopropyl alcohol and carbon dioxide is used as the processing gas. FIGS. 6A and 6B are views illustrating results of optical emission spectroscopy for plasma of carbon dioxide and plasma of an oxygen gas. FIG. 6A illustrates a result of optical emission spectroscopy for the plasma of the oxygen gas, and FIG. 6B illustrates a result of optical emission spectroscopy for the plasma of the carbon dioxide. The result of optical emission spectroscopy shown in FIG. 6A and the result of optical emission spectroscopy shown in FIG. 6B are obtained when using the plasma processing apparatus 10 under the following conditions.

Conditions for Acquiring Results of Optical Emission Spectroscopy Shown in FIG. 6A Pressure of a space in the processing container 12: 100 mTorr (13.33 Pa).
Processing gas: Oxygen gas to which 2% Ar gas is added and which has a flow rate of 700 sccm.
High frequency wave for plasma generation: 150 W.
High frequency bias: 700 W.

Conditions for Acquiring Results of Optical Emission Spectroscopy Shown in FIG. 6B Pressure of a space in the processing container 12: 100 mTorr (13.33 Pa).
Processing gas: Carbon dioxide gas to which 2% Ar gas is added and which has a flow rate of 700 sccm.
High frequency wave for plasma generation: 150 W.
High frequency bias: 700 W.

As shown in FIGS. 6A and 6B, relative light-emission intensity of oxygen in relation to Ar as active species in plasma of carbon dioxide is significantly smaller than relative light-emission intensity of oxygen in relation to Ar as active species in plasma of the oxygen gas, and corresponds to 12% of the light-emission intensity of the active species of oxygen in plasma of the oxygen gas. In the plasma of carbon dioxide, a generation amount of active species of oxygen is small. When performing ashing of an organic film under the same conditions as conditions of acquiring the results in the optical emission spectroscopy, an ashing rate of the organic film by the plasma of the carbon dioxide gas was 50% of an ashing rate of the organic film by the plasma of the oxygen gas. It was confirmed that when using the plasma of the carbon dioxide gas, the generation amount of the active species of oxygen is small, but a high ashing rate is obtained. In the step ST3, the step ST6, and the step ST7, that is, in the step of etching the magnetic layer in the method MT1, it is possible to remove a deposit that contains carbon derived from isopropyl alcohol, and it is possible to suppress a damage of the magnetic layer due to oxidation.

Hereinafter, description will be given of an experiment example in which the step ST2, the step ST3, the step ST5, the step ST6, and the step ST7 are executed by using the plasma processing apparatus 10 to etch the wafer W shown in FIG. 2A. Conditions in the experiment example are as follows.

Conditions of Step ST2

Pressure of in the processing container 12: 50 mTorr (6.65 Pa).
Processing gas: 150 sccm of $H_2$ gas and 50 sccm of $N_2$ gas.
High frequency wave for plasma generation: 200 W.
High frequency bias: 200 W.
Temperature of electrostatic chuck: −50° C.

Conditions of Step ST3, Step ST5, Step ST6, and Step ST7

Pressure in the processing container 12: 10 mTorr (1.333 Pa).
Processing gas: 250 sccm of Ar gas, 20 sccm of carbon dioxide gas, and 20 sccm of isopropyl alcohol gas.
High frequency wave for plasma generation: 300 W.
High frequency bias: 1000 W.
Temperature of electrostatic chuck: −50° C.

Comparative experimental examples 1 and 2 were performed for comparison. Comparative experimental example 1 is different from the experimental example in that 10 sccm of methanol gas and 200 sccm of Ne gas are used as the processing gas in the step ST3, the step ST5, the step ST6, and the step ST7. Comparative experimental example 2 is different from the experimental example in that 100 sccm of methanol gas is used as the processing gas in the step ST3, the step ST5, the step ST6, and the step ST7.

Figure 7:
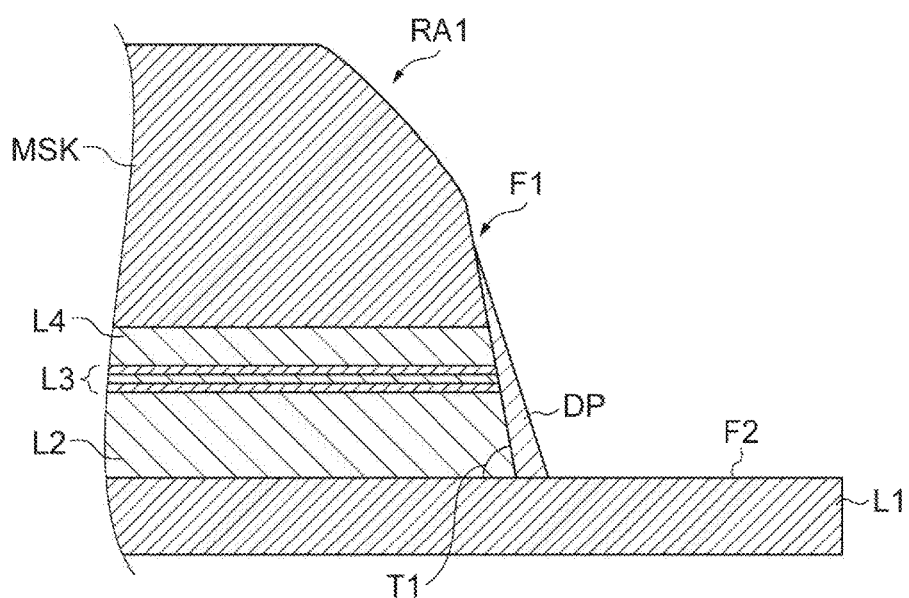
FIG. 7 is a cross-sectional view schematically illustrating a workpiece after etching.

FIG. 7 is a cross-sectional view schematically illustrating a wafer after etching. In the experimental example, comparative experimental example 1, and comparative experimental example 2, comparison was performed with respect to the magnitude of a taper angle T1 of a side surface F1 of the magnetic film L2, the MTJ layer L3, and the cap film L4 after etching, presence or absence of a deposit (indicated by a reference symbol DP in the drawing) on the side surface F1, and removal of a shoulder portion RA1 of the mask MSK (roundness of the shoulder portion). As a result, in a wafer after etching in comparative experimental example 1, a deposit adhered to the side surface F1, and although the removal of the shoulder portion RA1 was not greater in comparison to a wafer after etching in comparative experimental example 2, removal occurred in the shoulder portion RA1, and the taper angle T1 was approximately 76°. In the wafer after etching in comparative example 2, a deposit did not adhere to the side surface F1, but removal of the shoulder portion RA1 is great, and the taper angle T1 was approximately 70°. In the wafer after etching in the experimental example, a deposit did not adhere to the side surface F1, removal of the shoulder portion RA1 was small, and the taper angle T1 was approximately 80°. From the results, it was confirmed that according to the method MT1 of etching the magnetic layer by using the processing gas including isopropyl alcohol and carbon dioxide, it is possible to remove a deposit, it is possible to suppress the removal of the shoulder portion, and it is possible to increase vertical anisotropy in etching.

Second Embodiment

Figure 8:
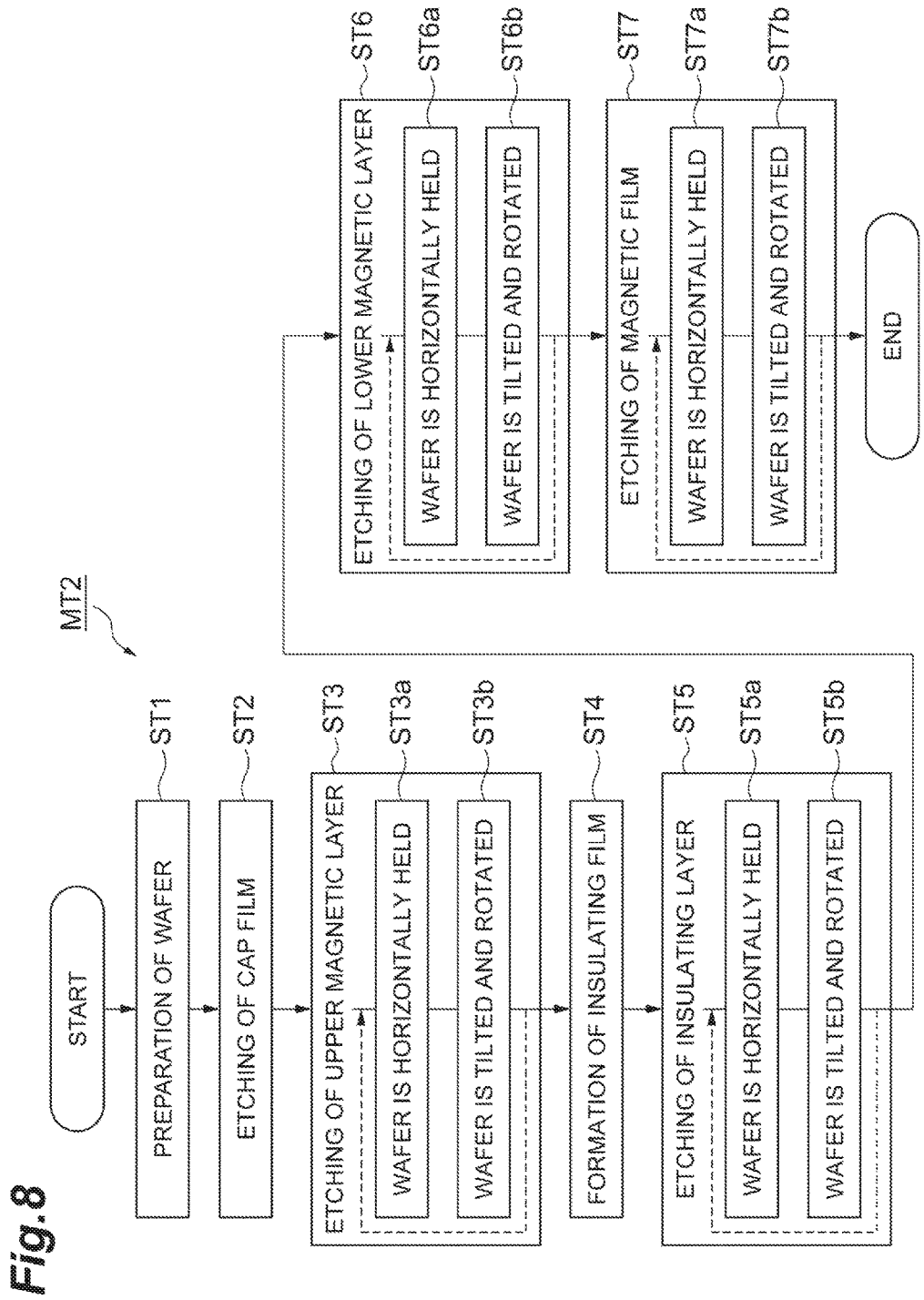
FIG. 8 is a flowchart illustrating an etching method according to a second embodiment.

FIG. 8 is a flowchart illustrating an etching method according to a second embodiment. A method MT2 shown in FIG. 8 includes the step ST1 to the step ST7 similar to the method MT1 shown in FIG. 1. However, the method MT2 is executed by using a plasma processing apparatus capable of realizing a state in which a wafer is horizontally supported and a state in which the wafer is tilted with respect to a vertical direction and is rotated similar to a plasma processing apparatus shown in FIG. 9 and FIG. 10.

Figure 9:
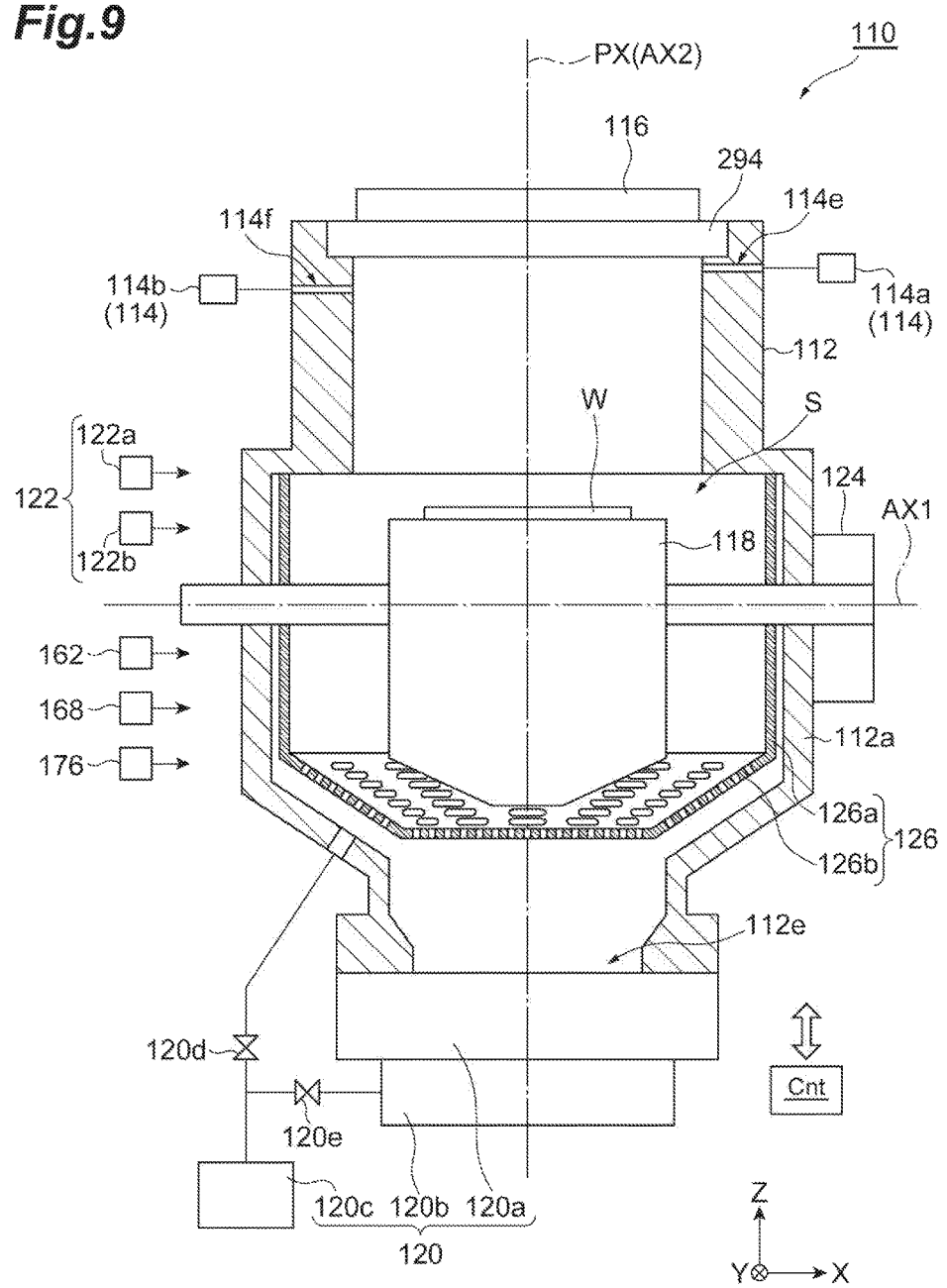
FIG. 9 is a view schematically illustrating an example of a plasma processing apparatus that can be used to carry out the method shown in FIG. 8.
Figure 10:
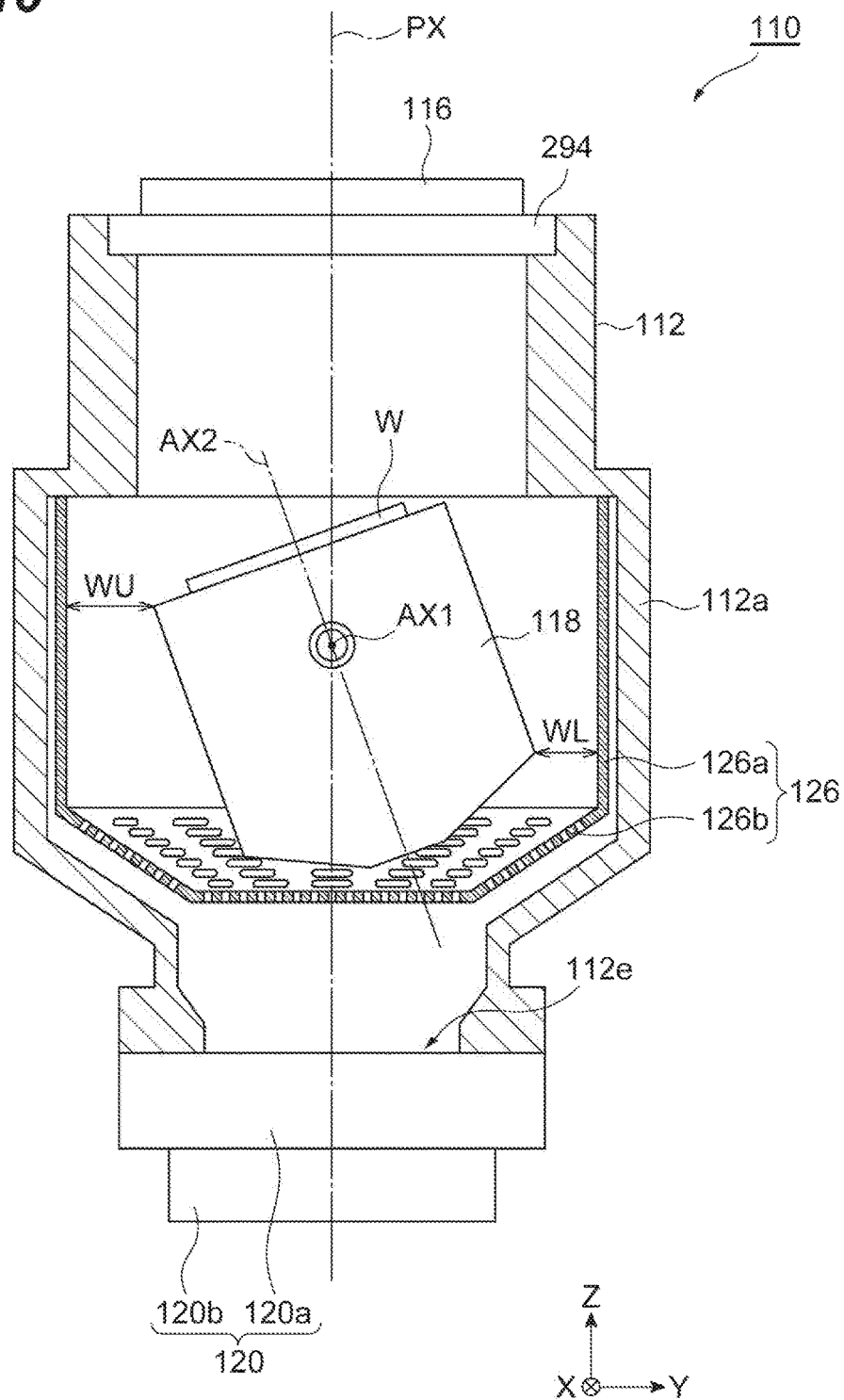
FIG. 10 is a view schematically illustrating an example of the plasma processing apparatus that can be used to carry out the method shown in FIG. 8.

FIGS. 9 and 10 are views schematically illustrating an example of a plasma processing apparatus that can be used to carry out the method shown in FIG. 8, and illustrate the plasma processing apparatus by breaking a processing container on one plane including an axis PX that extends in the vertical direction. FIG. 9 illustrates a plasma processing apparatus in a state in which the following support structure is not tilted, and FIG. 10 illustrates a plasma processing apparatus in a state in which the support structure is tilted.

A plasma processing apparatus 110 shown in FIGS. 9 and 10 include a processing container 112, a gas supply system 114, a plasma source 116, a support structure 118, an exhaust system 120, a bias power supply unit 122, and a control unit Cnt. The processing container 112 has a substantially cylindrical shape. A central axis of the processing container 112 coincides with the axis PX. The processing container 112 provides a space S for performing plasma processing with respect to the wafer W.

In an embodiment, the processing container 112 has approximately constant width at an intermediate portion 112a in a height direction, that is, in a portion in which the support structure 118 is accommodated. The processing container 112 has a tapered shape in which a width gradually narrows from a lower end of the intermediate portion toward the bottom. An exhaust port 112e is provided in the bottom of the processing container 112, and the exhaust port 112e is formed in an axial symmetry to the axis PX.

The gas supply system 114 is configured to supply a gas into the processing container 112. The gas supply system 114 includes a first gas supply unit 114a and a second gas supply unit 114b. The first gas supply unit 114a and the second gas supply unit 114b are configured to supply a processing gas, which is used in the method MT2, into the processing container 112. The processing gas, which is used in the method MT2, may be supplied into the processing container 112 from any one or both of the first gas supply unit 114a and the second gas supply unit 114b. The first gas supply unit 114a and the second gas supply unit 114b may supply a plurality of kinds of gases, which constitutes the processing gas to be used in the method MT2, into the processing container 112 in a sharing manner in accordance with the degree of dissociation required for the plurality of kinds of gases. Details of the gas supply system 114 will be described later.

The plasma source 116 is configured to excite a gas supplied into the processing container 112. In an embodiment, the plasma source 116 is provided in a ceiling portion of the processing container 112. In the embodiment, the central axis of the plasma source 116 coincides with the axis PX. Details of an example of the plasma source 116 will be described later.

The support structure 118 is configured to hold the wafer W at the inside of the processing container 112. The support structure 118 is configured to rotate around a first axis AX1 perpendicular to the axis PX, that is, around a tilt axis. The support structure 118 can be tilted with respect to the axis PX through rotation around the first axis AX1. The plasma processing apparatus 110 includes a drive device 124 to tilt the support structure 118. The drive device 124 is provided outside the processing container 112, and generates a driving force for rotation of the support structure 118 around the first axis AX1. The support structure 118 is configured to rotate the wafer W around a second axis AX2 perpendicular to the first axis AX1, that is, around a central axis of the electrostatic chuck 132. In a state in which the support structure 118 is not tilted, as shown in FIG. 9, the second axis AX2 coincides with the axis PX. On the other hand, in a state in which the support structure 118 is tilted, as shown in FIG. 10, the second axis AX2 is inclined with respect to the axis PX. Details of the support structure 118 will be described later.

The exhaust system 120 is configured to reduce the pressure of a space inside the processing container 112. In an embodiment, the exhaust system 120 includes an automatic pressure controller 120a, a turbomolecular pump 120b, and a dry pump 120c. The turbomolecular pump 120b is provided downstream of the automatic pressure controller 120a. The dry pump 120c is directly connected to the space inside the processing container 112 through a valve 120d. The dry pump 120c is provided downstream of the turbomolecular pump 120b through a valve 120e.

The exhaust system including the automatic pressure controller 120a and the turbomolecular pump 120b is attached to the bottom of the processing container 112. The exhaust system including the automatic pressure controller 120a and the turbomolecular pump 120b is provided immediately below the support structure 118. In the plasma processing apparatus 110, it is possible to provide a uniform exhaust flow from the periphery of the support structure 118 to the exhaust system 120. Accordingly, it is possible to accomplish efficient exhaust, and to uniformly diffuse plasma generated in the processing container 112.

In an embodiment, a rectification member 126 may be provided in the processing container 112. The rectification member 126 has a substantially tubular shape of which a lower end is closed. The rectification member 126 extends along an inner wall surface of the processing container 112 to surround the support structure 118 from a lateral side and a lower side. In an example, the rectification member 126 includes an upper portion 126a and a lower portion 126b. The upper portion 126a has a cylindrical shape having a constant width, and extends along an inner wall surface of the intermediate portion 112a of the processing container 112. The lower portion 126b continues to the upper portion 126a on a lower side of the upper portion 126a. The lower portion 126b has a tapered shape of which a width gradually decreases along the inner wall surface of the processing container 112, and has a flat plate shape at a lower end. A plurality of openings (through-holes) are formed in the lower portion 126b. The rectification member 126 can provide a pressure difference between an inner side of the rectification member 126, that is, a space in which the wafer W is accommodated, and an outer side of the rectification member 126, that is, a space on an exhaust side, and can adjust a residence time of a gas in the space in which the wafer W is accommodated. In addition, the rectification member 126 can provide uniform exhaust.

The bias power supply unit 122 is configured to selectively apply a bias voltage and a high frequency bias for attraction of ions to the wafer W to the support structure 118. In an embodiment, the bias power supply unit 122 includes a first power supply 122a and a second power supply 122b. The first power supply 122a generates a pulse modulated DC voltage (hereinafter, referred to as "modulated DC voltage") as a bias voltage that is applied to the support structure 118.

The second power supply 122b is configured to supply a high frequency bias for attraction of ions to the wafer W to the support structure 118. A frequency of the high frequency bias is an arbitrary frequency that is suitable to attract ions to the wafer W, and is 400 kHz as an example. In the plasma processing apparatus 110, it is possible to selectively supply the modulated DC voltage from the first power supply 122a and the high frequency bias from the second power supply 122b to the support structure 118. The selective supply of the modulated DC voltage and the high frequency bias can be controlled by the control unit Cnt.

For example, the control unit Cnt is a computer including a processor, a storage unit, an input device, a display device, and the like. The control unit Cnt operates in accordance with a program based on an input recipe to transmit a control signal. Respective units of the plasma processing apparatus 110 are controlled by the control signal transmitted from the control unit Cnt.

Hereinafter, the gas supply system 114, the plasma source 116, and the support structure 118 will be described in detail.

Gas Supply System

As described above, the gas supply system 114 includes the first gas supply unit 114a and the second gas supply unit 114b. The first gas supply unit 114a supplies a gas into the processing container 112 through one or more gas ejection holes 114e. The second gas supply unit 114b supplies a gas into the processing container 112 through one or more gas ejection holes 114f. The gas ejection holes 114e are provided at a position that is closer to the plasma source 116 than the gas ejection hole 114f. Accordingly, the degree of dissociation of the gas supplied from the first gas supply unit 114a becomes higher than the degree of dissociation of a gas that is supplied from the second gas supply unit 114b. In FIGS. 9 and 10, the number of the gas ejection holes 114e and the number of the gas ejection holes 114f are respectively set to "1", but a plurality of the gas ejection holes 114e and a plurality of gas ejection holes 114f may be provided. The plurality of gas ejection holes 114e may be uniformly arranged in a circumferential direction with respect to the axis PX. The plurality of gas ejection holes 114f also may be arranged in the circumferential direction of the axis PX.

In an embodiment, a partition plate, a so-called ion trap may be provided between a region to which a gas is ejected through each of the gas ejection holes 114e and a region to which a gas is ejected through each of the gas ejection holes 114f. The ion trap can adjust the amount of ions which move to the wafer W from plasma of the gas supplied by the first gas supply unit 114a.

The first gas supply unit 114a may include one or more gas sources, one or more flow rate controllers, and one or more valves. Accordingly, it is possible to adjust a flow rate of gases supplied from the one or more gas sources of the first gas supply unit 114a. The second gas supply unit 114b may include one or more gas sources, one or more flow rate controllers, and one or more valves. Accordingly, it is possible to adjust a flow rate of gases supplied from the one or more gas sources of the second gas supply unit 114b. The flow rate of the gas supplied from the first gas supply unit 114a and supply timing of the gas, and the flow rate of the gas supplied from the second gas supply unit 114b and supply timing of the gas are individually adjusted by the control unit Cnt.

As an example, the processing gas, which is used in the step ST3, the step ST4, the step ST5, the step ST6, and the step ST7, is supplied into the processing container 112 from both the first gas supply unit 114a and the second gas supply unit 114b. As another example, the processing gas, which is used in the step ST3, the step ST4, the step ST5, the step ST6, and the step ST7, is supplied into the processing container 112 from any one of the first gas supply unit 114a and the second gas supply unit 114b.

As still another example, the first gas supply unit 114a and the second gas supply unit 114b may supply a plurality of kinds of gases included in the processing gas, which is used in the step ST3, the step ST4, the step ST5, the step ST6, and the step ST7, into the processing container 112 in a sharing manner in accordance with the degree of dissociation required for the plurality of kinds of gases. For example, in the step ST3, the step ST5, the step ST6, and the step ST7, one or more kinds of gases among isopropyl alcohol, carbon dioxide, and a rare gas may be supplied from the first gas supply unit 114a, and one or more other gases among isopropyl alcohol, carbon dioxide, and the rare gas may be supplied from the second gas supply unit 114b.

Plasma Source

Figure 11:
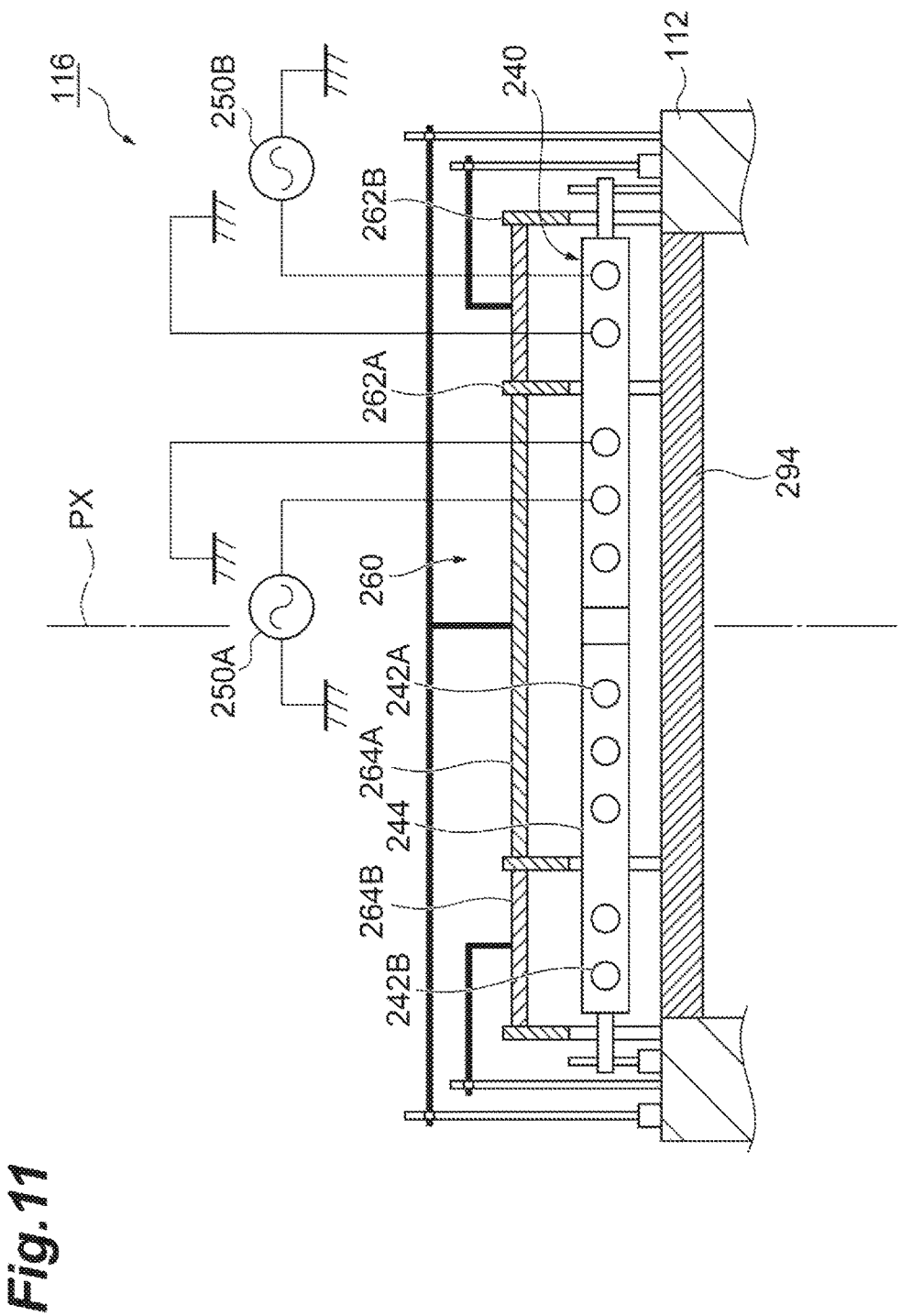
FIG. 11 is a view illustrating a plasma source of the plasma processing apparatus shown in FIG. 9.
Figure 12:
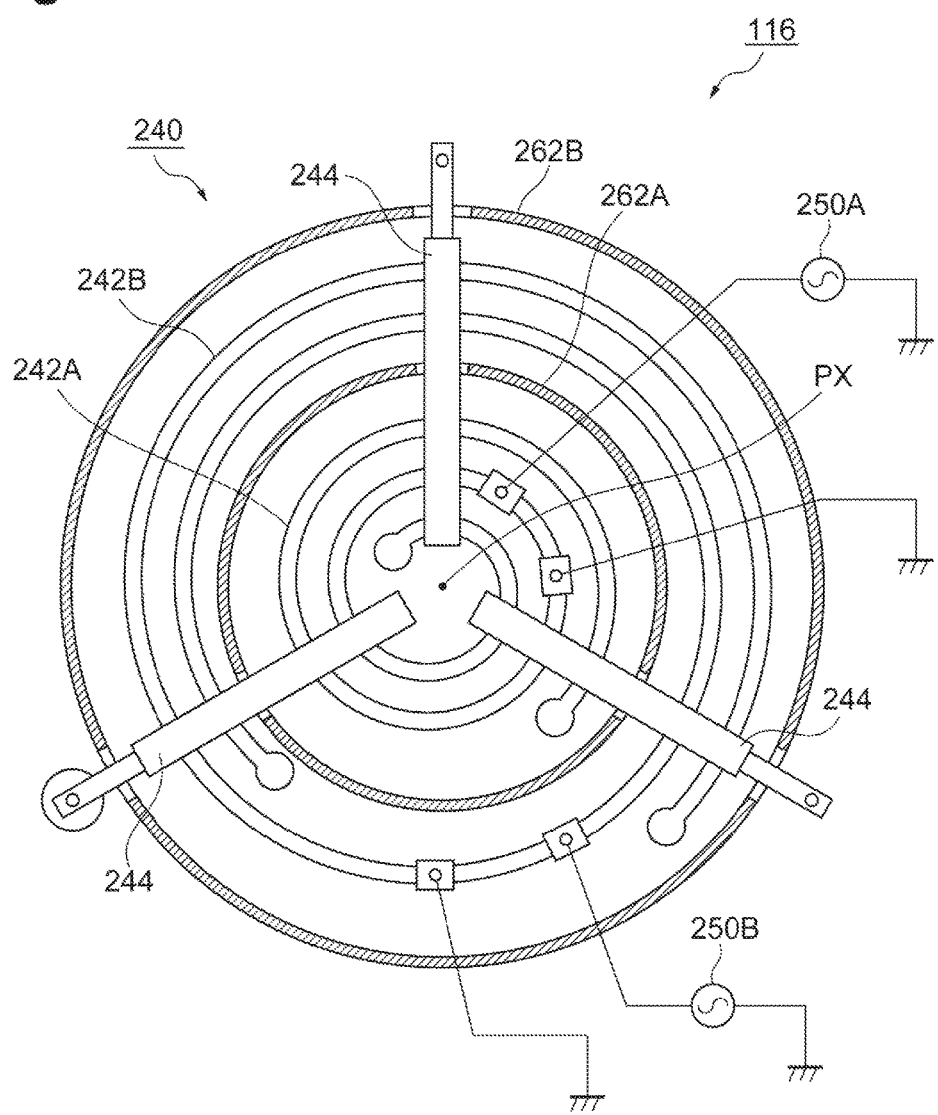
FIG. 12 is a view illustrating the plasma source of the plasma processing apparatus shown in FIG. 9.

FIG. 11 is a view illustrating the plasma source of the plasma processing apparatus shown in FIG. 9, and a view illustrating the plasma source that is seen from a Y direction in FIG. 9. FIG. 12 is a view illustrating the plasma source of the plasma processing apparatus shown in FIG. 9, and is a view illustrating the plasma source that is seen from a vertical direction. As shown in FIG. 9 and FIG. 10, an opening is provided in the ceiling portion of the processing container 112, and the opening is closed by a dielectric plate 294. The dielectric plate 294 is a plate-shaped body, and is formed from quartz glass or ceramic. The plasma source 116 is provided on the dielectric plate 294.

As shown in FIG. 11 and FIG. 12, the plasma source 116 includes a high frequency antenna 240 and a shield member 260. The high frequency antenna 240 is covered with the shield member 260. In an embodiment, the high frequency antenna 240 includes an inner antenna element 242A and an outer antenna element 242B. The inner antenna element 242A is provided to be closer to the axis PX than the outer antenna element 242B. In other words, the outer antenna element 242B is provided outside the inner antenna element 242A to surround the inner antenna element 242A. For example, each of the inner antenna element 242A and the outer antenna element 242B is formed from a conductor such as copper, aluminum, and stainless steel, and extends spirally around the axis PX.

The inner antenna element 242A and the outer antenna element 242B are held by a plurality of holding bodies 244 to be integrated with each other. For example, the plurality of holding bodies 244 are rod-shaped members and are provided radially with respect to the axis PX.

The shield member 260 includes an inner shield wall 262A and an outer shield wall 262B. The inner shield wall 262A has a tubular shape that extends in the vertical direction, and is provided between the inner antenna element 242A and the outer antenna element 242B. The inner shield wall 262A surrounds the inner antenna element 242A. The outer shield wall 262B has a tubular shape that extends in the vertical direction, and is provided to surround the outer antenna element 242B.

An inner shield plate 264A is provided on the inner antenna element 242A. The inner shield plate 264A has a disc shape and is provided to cover an opening of the inner shield wall 262A. An outer shield plate 264B is provided on the outer antenna element 242B. The outer shield plate 264B is an annular plate, and is provided to cover an opening between the inner shield wall 262A and the outer shield wall 262B.

A high frequency power supply 250A and a high frequency power supply 250B are respectively connected to the inner antenna element 242A and the outer antenna element 242B. The high frequency power supply 250A and the high frequency power supply 250B are high frequency power supplies for plasma generation. The high frequency power supply 250A and the high frequency power supply 250B supply high frequency waves, which have the same frequency or frequencies different from each other, to the inner antenna element 242A and the outer antenna element 242B. For example, when supplying a high frequency wave of a predetermined frequency (for example, 40 MHz) from the high frequency power supply 250A to the inner antenna element 242A with predetermined power, the processing gas, which is introduced into the processing container 112, is excited by an induced magnetic field formed in the processing container 112, and donut-shaped plasma is generated at the central portion on the wafer W. When supplying a high frequency wave of a predetermined frequency (for example, 60 MHz) from the high frequency power supply 250B to the outer antenna element 242B with predetermined power, the processing gas, which is introduced into the processing container 112, is excited by an induced magnetic field formed in the processing container 112, and different donut-shaped plasma is generated at a peripheral portion on the wafer W. Radicals are generated from the processing gas by the plasma.

The frequency of the high frequency waves, which are output from the high frequency power supply 250A and the high frequency power supply 250B, are not limited to the above-described frequency. For example, the frequency of the high frequency waves, which are output from the high frequency power supply 250A and the high frequency power supply 250B, may be various frequencies such as 13.56 MHz, 27 MHz, 40 MHz, and 60 MHz. However, it is necessary to adjust the electrical length of the inner antenna element 242A and the outer antenna element 242B in accordance with the high frequency waves which are output from the high frequency power supply 250A and the high frequency power supply 250B.

The plasma source 116 can ignite plasma of the processing gas even under an environment of a pressure of 1 mTorr (0.1333 Pa). A mean free path of ions in the plasma increases under a low-pressure environment. Accordingly, it is possible to perform etching by sputtering ions of rare gas atoms. Under the low-pressure environment, it is possible to exhaust an etched material while suppressing the etched material from adhering again to the wafer W.

Support Structure

Figure 13:
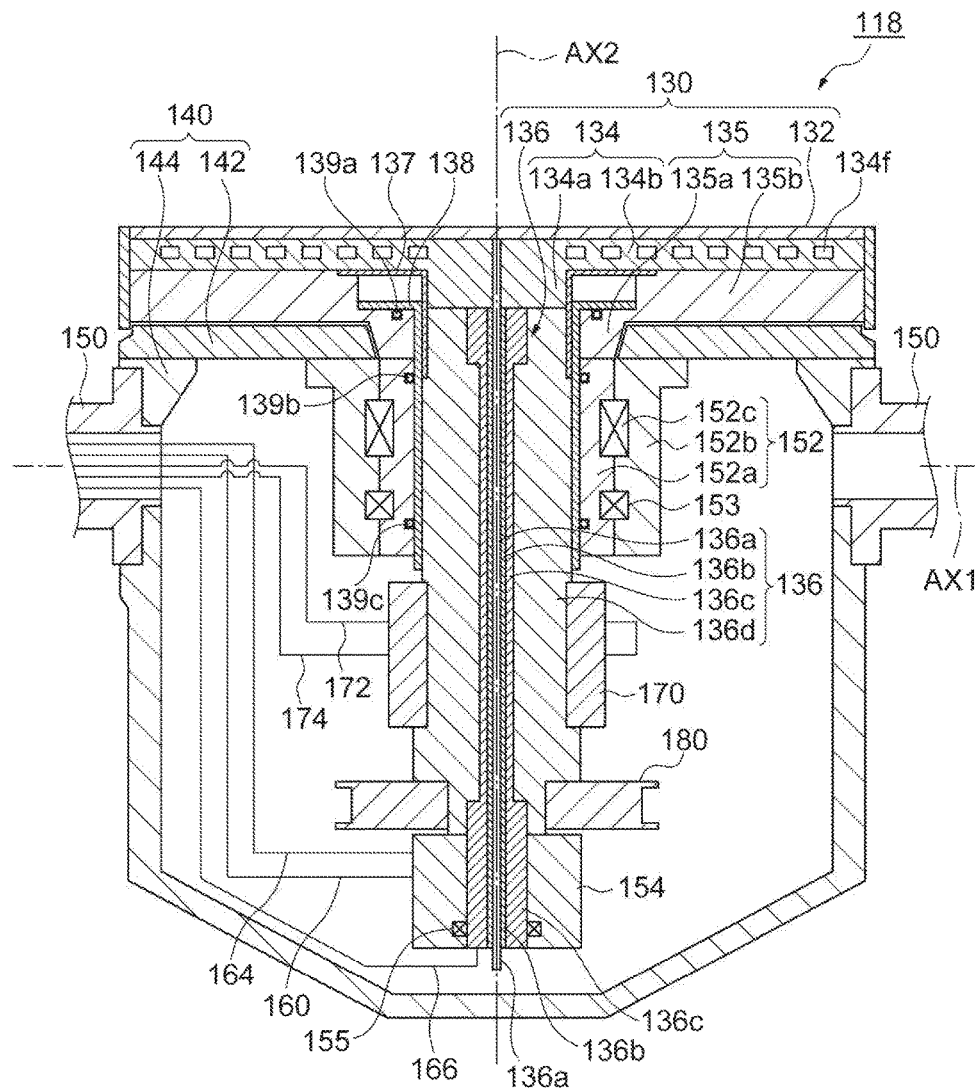
FIG. 13 is a cross-sectional view illustrating a support structure of the plasma processing apparatus shown in FIG. 9.
Figure 14:
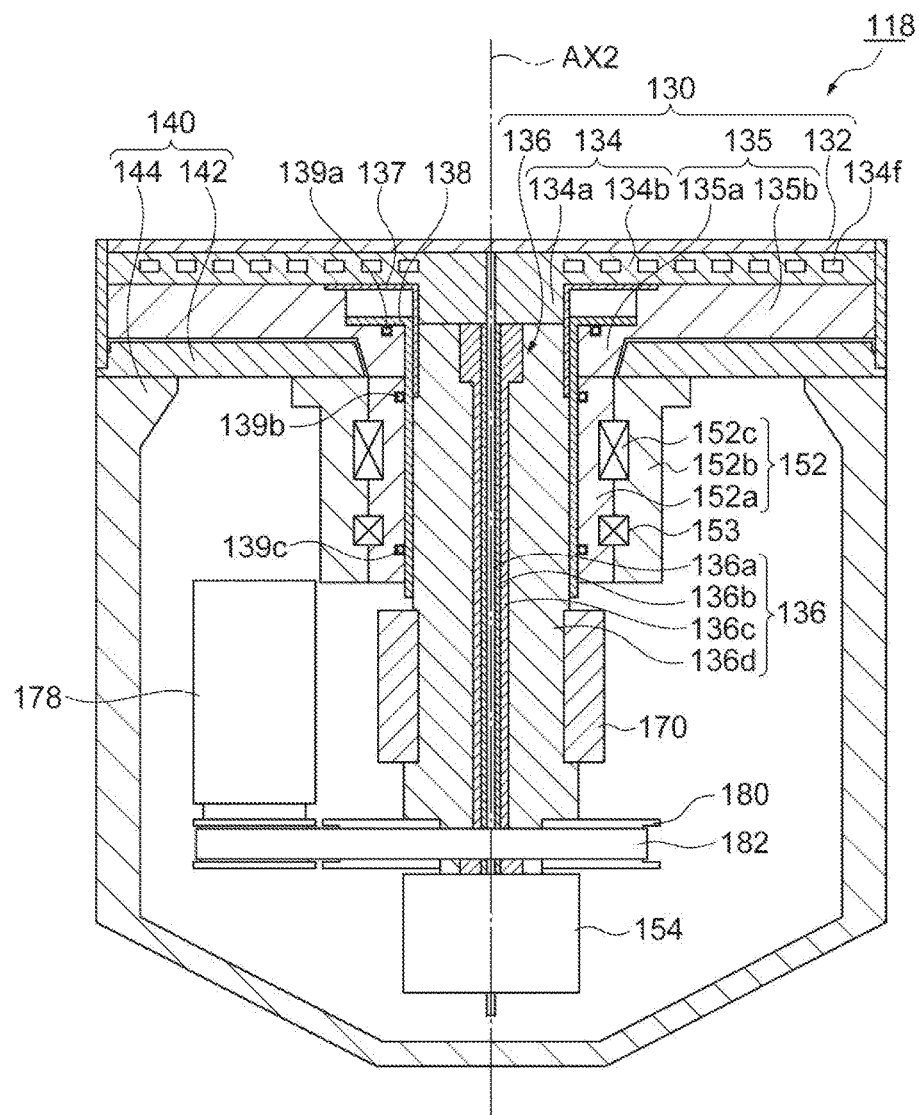
FIG. 14 is a cross-sectional view illustrating the support structure of the plasma processing apparatus shown in FIG. 9.

FIGS. 13 and 14 are cross-sectional views illustrating the support structure of the plasma processing apparatus shown in FIG. 9. FIG. 13 illustrates cross-sectional view of the support structure that is seen from the Y direction (refer to FIG. 9), and FIG. 14 illustrates a cross-sectional view of the support structure that is seen from an X direction (refer to FIG. 9). As shown in FIGS. 13 and 14, the support structure 118 includes a holding unit 130, a container part 140, and a tilt shaft part 150.

The holding unit 130 is a mechanism that holds the wafer W and rotates around the second axis AX2 to rotate the wafer W. As described above, the second axis AX2 coincides with the axis PX in a state in which the support structure 118 is not tilted. The holding unit 130 includes an electrostatic chuck 132, a lower electrode 134, a rotary shaft part 136, and an insulating member 135.

The electrostatic chuck 132 is configured to hold the wafer W on an upper surface thereof. The electrostatic chuck 132 has a substantially disc shape in which the second axis AX2 is set as a central axis thereof, and includes an electrode film that is provided as an inner layer of an insulating film. When a voltage is applied to the electrode film, the electrostatic chuck 132 generates an electrostatic force. The electrostatic chuck 132 holds the wafer W mounted on the upper surface thereof by the electrostatic force. A heat transfer gas such as a He gas is supplied between the electrostatic chuck 132 and the wafer W. A heater configured to heat the wafer W may be embedded in the electrostatic chuck 132. The electrostatic chuck 132 is provided on the lower electrode 134.

The lower electrode 134 has a substantially disc shape in which the second axis AX2 is set as a central axis thereof. In an embodiment, the lower electrode 134 includes a first portion 134a and a second portion 134b. The first portion 134a is a portion on a central side of the lower electrode 134 and extends along the second axis AX2. The second portion 134b is a portion that is further spaced away from the second axis AX2 than the first portion 134a and extends in an outer side with respect to the first portion 134a. An upper surface of the first portion 134a and an upper surface of the second portion 134b continue from each other, and a substantially flat upper surface of the lower electrode 134 is constituted by the upper surface of the first portion 134a and the upper surface of the second portion 134b. The electrostatic chuck 132 is in contact with the upper surface of the lower electrode 134. The first portion 134a protrudes downwardly with respect to the second portion 134b to form a circular column shape. That is, a lower surface of the first portion 134a extends on a lower side in comparison to a lower surface of the second portion 134b. The lower electrode 134 is formed from a conductor such as aluminum. The lower electrode 134 is electrically connected to the bias power supply unit 122. That is, the modulated DC voltage from the first power supply 22a and the high frequency bias from the second power supply 22b can be selectively supplied to the lower electrode 134. A coolant flow passage 134f is provided in the lower electrode 134. A coolant is supplied to the coolant flow passage 134f to control a temperature of the wafer W. The lower electrode 134 is provided on the insulating member 135.

The insulating member 135 is formed from an insulator such as quartz and alumina, and has a substantially disc shape of which center is opened. In an embodiment, the insulating member 135 includes a first portion 135a and a second portion 135b. The first portion 135a is a portion on a central side of the insulating member 135, and the second portion 135b is a portion that is further spaced away from the second axis AX2 than the first portion 135a and extends in an outer side with respect to the first portion 135a. An upper surface of the first portion 135a extends on a lower side with respect to an upper surface of the second portion 135b, and a lower surface of the first portion 135a also extends on a lower side with respect to a lower surface of the second portion 135b. The upper surface of the second portion 135b of the insulating member 135 is in contact with the lower surface of the second portion 134b of the lower electrode 134. On the other hand, the upper surface of the first portion 135a of the insulating member 135 is spaced away from a lower surface of the lower electrode 134.

The rotary shaft part 136 has a substantially circular column shape, and is coupled to the lower surface of the lower electrode 134. Specifically, the rotary shaft part 136 is coupled to the lower surface of the first portion 134a of the lower electrode 134. The central axis of the rotary shaft part 136 coincides with the second axis AX2. When a rotation force is applied to the rotary shaft part 136, the holding unit 130 rotates.

The holding unit 130, which is configured with the aforementioned various elements, forms a hollow space as an internal space of the support structure 118 in combination with the container part 140. The container part 140 includes an upper container part 142 and an outer container part 144. The upper container part 142 has a substantially disc shape. A through-hole, through which the rotary shaft part 136 passes, is formed in the center of the upper container part 142. The upper container part 142 is provided to form a slight gap with respect to the second portion 135b, below the second portion 135b of the insulating member 135. An upper end of the outer container part 144 is coupled to a peripheral edge of a lower surface of the upper container part 142. The outer container part 144 has a substantially cylindrical shape of which lower end is closed.

A magnetic fluid sealing part 152 is provided between the container part 140 and the rotary shaft part 136. The magnetic fluid sealing part 152 includes an inner wheel 152a and an outer wheel 152b. The inner wheel 152a has a substantially cylindrical shape that extends coaxially with the rotary shaft part 136, and is fixed to the rotary shaft part 136. An upper end of the inner wheel 152a is coupled to the lower surface of the first portion 135a of the insulating member 135. The inner wheel 152a is configured to rotate around the second axis AX2 in combination with the rotary shaft part 136. The outer wheel 152b has a substantially cylindrical shape, and is provided coaxially with the inner wheel 152a on an outer side of the inner wheel 152a. An upper end of the outer wheel 152b is coupled to a lower surface of a central portion of the upper container part 142. A magnetic fluid 152c is interposed between the inner wheel 152a and the outer wheel 152b. A bearing 153 is provided between the inner wheel 152a and the outer wheel 152b below the magnetic fluid 152c. The magnetic fluid sealing part 152 provides a sealing structure that air-tightly seals the internal space of the support structure 118. The internal space of the support structure 118 is separated from the space S of the plasma processing apparatus 110 due to the magnetic fluid sealing part 152. In the plasma processing apparatus 110, the internal space of the support structure 118 is maintained to the atmospheric pressure.

In an embodiment, a first member 137 and a second member 138 are provided between the magnetic fluid sealing part 152 and the rotary shaft part 136. The first member 137 has a substantially cylindrical shape that extends along a part of an outer peripheral surface of the rotary shaft part 136, that is, along an outer peripheral surface of an upper portion of a third tubular part 136d to be described later and an outer peripheral surface of the first portion 134a of the lower electrode 134. An upper end of the first member 137 has an annular plate shape that extends along a lower surface of the second portion 134b of the lower electrode 134. The first member 137 is in contact with an outer peripheral surface of an upper portion of the third tubular part 136d, an outer peripheral surface of the first portion 134a and a lower surface of the second portion 134b in the lower electrode 134.

The second member 138 has a substantially cylindrical shape that extends along an outer peripheral surface of the rotary shaft part 136, that is, along an outer peripheral surface of the third tubular part 136d and an outer peripheral surface of the first member 137. An upper end of the second member 138 has an annular plate shape that extends along an upper surface of the first portion 135a of the insulating member 135. The second member 138 is in contact with the outer peripheral surface of the third tubular part 136d, the outer peripheral surface of the first member 137, the upper surface of the first portion 135a of the insulating member 135, and an inner peripheral surface of the inner wheel 152a of the magnetic fluid sealing part 152. A sealing member 139a such as an O-ring is interposed between the second member 138 and the upper surface of the first portion 135a of the insulating member 135. Sealing members 139b and 139c such as an O-ring are interposed between the second member 138 and the inner peripheral surface of the inner wheel 152a of the magnetic fluid sealing part 152. The structure provides sealing between the rotary shaft part 136 and the inner wheel 152a of the magnetic fluid sealing part 152. Accordingly, even when a gap exists between the rotary shaft part 136 and the magnetic fluid sealing part 152, the internal space of the support structure 118 is separated from the space S of the plasma processing apparatus 110.

An opening is formed in the outer container part 144 along the first axis AX1. An inner end of the tilt shaft part 150 is fitted into the opening formed in the outer container part 144. The tilt shaft part 150 has a substantially cylindrical shape, and the central axis thereof coincides with the first axis AX1. As shown in FIG. 9, the tilt shaft part 150 extends to an outer side of the processing container 112. The above-described drive device 124 is coupled to an outer end on one side of the tilt shaft part 150. The drive device 124 supports the outer end of the tilt shaft part 150 around the first axis AX1. When the tilt shaft part 150 rotates by the drive device 124, the support structure 118 rotates around the first axis AX1, and as a result, the support structure 118 is tilted with respect to the axis PX. For example, the support structure 118 can be tilted so that the second axis AX2 makes an angle in a range of 0° to 60° with the axis PX.

In an embodiment, the first axis AX1 includes a central position of the support structure 118 in a direction of the second axis AX2. In this embodiment, the tilt shaft part 150 extends on the first axis AX1 that passes through the center of the support structure 118. In this embodiment, it is possible to enlarge the minimum distance out of the shortest distance WU (refer to FIG. 10) between an upper edge of the support structure 118 and the processing container 112 (or the rectification member 126), and the shortest distance WL (refer to FIG. 10) between a lower edge of the support structure 118 and the processing container 112 (or the rectification member 126), when the support structure 118 is tilted. That is, it is possible to maximize the minimum distance between a contour of the support structure 118 and the processing container 112 (or the rectification member 126). Accordingly, it is possible to reduce a width of the processing container 112 in a horizontal direction.

In another embodiment, the first axis AX1 includes a position between the center of the support structure 118 in a direction of the second axis AX2 and an upper surface of the holding unit 130. That is, in this embodiment, the tilt shaft part 150 extends at a position that deviates to the holding unit 130 side in relation to the center of the support structure 118. According to this embodiment, when the support structure 118 is tilted, it is possible to reduce a difference in a distance from the plasma source 116 to each position of the wafer W. Accordingly, in-plane uniformity of etching is further improved. It should be noted that the support structure 118 may be tilted at an angle of 60° or less.

In still another embodiment, the first axis AX1 includes the center of gravity of the support structure 118. In this embodiment, the tilt shaft part 150 extends on the first axis AX1 including the center of gravity. According to this embodiment, torque required for the drive device 124 decreases, and thus a control of the drive device 124 becomes easy.

Referring to FIGS. 13 and 14 again, various interconnections for an electrical system, a pipe for a heat transfer gas, and a pipe for a coolant pass through the inner hole of the tilt shaft part 150. The interconnections and the pipes are connected to the rotary shaft part 136.

The rotary shaft part 136 includes a columnar part 136a, a first tubular part 136b, a second tubular part 136c, and a third tubular part 136d. The columnar part 136a has a substantially circular column shape, and extends on the second axis AX2. The columnar part 136a is an interconnection configured to apply a voltage to the electrode film of the electrostatic chuck 132. The columnar part 136a is connected to an interconnection 160 through a rotary connector 154 such as a slip ring. The interconnection 160 passes through the inner hole of the tilt shaft part 150 from the internal space of the support structure 118, and extends to an outer side of the processing container 112. The interconnection 160 is connected to a power supply 162 (refer to FIG. 9) through a switch on an outer side of the processing container 112.

The first tubular part 136b is provided coaxially with the columnar part 136a on an outer side of the columnar part 136a. The first tubular part 136b is an interconnection configured to supply the modulated DC voltage and the high frequency bias to the lower electrode 134. The first tubular part 136b is connected to an interconnection 164 through a rotary connector 154. The interconnection 164 passes through the inner hole of the tilt shaft part 150 from the internal space of the support structure 118, and extends to an outer side of the processing container 112. The interconnection 164 is connected to the first power supply 122a and the second power supply 122b of the bias power supply unit 122 on an outer side of the processing container 112. A matching unit for impedance matching may be provided between the second power supply 122b and the interconnection 164.

The second tubular part 136c is provided coaxially with the first tubular part 136b on an outer side of the first tubular part 136b. In an embodiment, a bearing 155 is provided at the inside of the rotary connector 154, and the bearing 155 extends along an outer peripheral surface of the second tubular part 136c. The bearing 155 supports the rotary shaft part 136 through the second tubular part 136c. The bearing 153 supports an upper portion of the rotary shaft part 136 and the bearing 155 supports a lower portion of the rotary shaft part 136. In this manner, since the rotary shaft part 136 is supported at the upper portion and the lower portion by the two bearings 153 and 155, it is possible to stably rotate the rotary shaft part 136 around the second axis AX2.

A gas line for supply of a heat transfer gas is formed in the second tubular part 136c. The gas line is connected to a pipe 166 through a rotary joint such as a swivel joint. The pipe 166 passes through the inner hole of the tilt shaft part 150 from the internal space of the support structure 118, and extends to an outer side of the processing container 112. The pipe 166 is connected to a heat transfer gas source 168 (refer to FIG. 9) on an outer side of the processing container 112.

The third tubular part 136d is provided coaxially with the second tubular part 136c on an outer side of the second tubular part 136c. In the third tubular part 136d, a coolant supply line configured to supply a coolant to the coolant flow passage 134f, and a coolant return line that collects the coolant that is supplied to the coolant flow passage 134f are formed. The coolant supply line is connected to a pipe 172 through a rotary joint 170 such as a swivel joint. In addition, the coolant return line is connected to a pipe 174 through a rotary joint 170. The pipe 172 and the pipe 174 pass through the inner hole of the tilt shaft part 150 from the internal space of the support structure 118, and extend to an outer side of the processing container 112. The pipe 172 and the pipe 174 are connected to a chiller unit 176 (refer to FIG. 9) on an outer side of the processing container 112.

As shown in FIG. 14, a rotary motor 178 is provided in the internal space of the support structure 118. The rotary motor 178 generates a driving force for rotating the rotary shaft part 136. In an embodiment, the rotary motor 178 is provided on a lateral side of the rotary shaft part 136. The rotary motor 178 is connected to a pulley 180 attached to the rotary shaft part 136 through a transmission belt 182. Accordingly, a rotary driving force of the rotary motor 178 is transmitted to the rotary shaft part 136, and the holding unit 130 rotates around the second axis AX2. For example, the number of rotations of the holding unit 130 is in a range of 48 rpm or less. For example, the rotational frequency of the holding unit 130 during the process is 20 rpm. Furthermore, an interconnection for supplying a power to the rotary motor 178 passes through the inner hole of the tilt shaft part 150, is led out to an outer side of the processing container 112, and is connected to a motor power supply provided on the outer side of the processing container 112.

As described above, in the support structure 118, various mechanisms may be provided in the internal space capable of being maintained at the atmospheric pressure. In addition, the support structure 118 has a configuration in which interconnections or pipes connecting the mechanisms accommodated in the internal space with the device such as the power supply, the gas sources and the chiller unit, which are provided on the outer side of the processing container 112, are capable of being led out to the outer side of the processing container 112. In addition to the interconnections and the pipes, an interconnection for connection between a heater power supply provided on the outer side of the processing container 112 and the heater provided in the electrostatic chuck 132 may be led out from the internal space of the support structure 118 to the outer side of the processing container 112 through the inner hole of the tilt shaft part 150.

During etching of respective layers of the multi-layer film shown in FIG. 2A, a material removed by the etching, that is, a magnetic material, or excessive carbon derived from isopropyl alcohol adhere to a surface of a feature formed by the etching, particularly, a side surface thereof without being exhausted. According to the plasma processing apparatus 110, when removing the deposit formed on the side surface, the support structure 118 is tilted, and the holding unit 130 that holds the wafer W can be allowed to rotate around the second axis AX2. Accordingly, active species can be incident toward the whole region of the side surface of the feature formed by the etching, and thus it is possible to improve in-plane uniformity of ion incidence with respect to the wafer W. As a result, in the whole region of the side surface of the feature formed by the etching, it is possible to remove the deposit adhered to the side surface, and increase verticality of the feature. In addition, it is possible to uniformly perform removal of the deposit in a plane of the wafer W, and thus in-plane uniformity of the feature formed by the etching is improved.

Hereinafter, description will be given of the MT2 with reference to FIG. 8 again. The following description will be made with reference to FIGS. 15-17 in addition to FIG. 8. FIG. 15A is the same cross-sectional view as FIG. 2A, and illustrates a wafer W in a state before application of the method MT2. FIGS. 15B-15D, FIGS. 16A-16D, and FIGS. 17A-17D are cross-sectional views illustrating products obtained by respective steps of the method MT2. In the following description, description will be given of an example in which the method MT2 is executed with respect to the wafer W by using the plasma processing apparatus 110. An arbitrary plasma processing apparatus can be used to execute the method MT2 when the plasma processing apparatus is capable of producing a state in which the wafer W is horizontally held and a state in which the wafer W is tilted with respect to a vertical direction and is rotated.

In the method MT2, first, in a step ST1, the wafer W shown in FIG. 15A is prepared, and is accommodated in the processing container 112 of the plasma processing apparatus 110. The wafer W is held by the electrostatic chuck 132 of the holding unit 130.

In the method MT2, a step ST2 is subsequently executed. In the step ST2, plasma of a processing gas is generated at the inside of the processing container 112. As an example, plasma of a processing gas, which includes a $H_2$ gas, is generated to etch the cap film L4 that is constituted by Ru. The processing gas used in the step ST2 may further include an inert gas such as a $N_2$ gas. In the step ST2, a processing gas is supplied into the processing container 112 from at least one of the first gas supply unit 114a and the second gas supply unit 114b, and the exhaust system 120 operates. Accordingly, a pressure inside the processing container 112, that is, a process pressure is set to a predetermined pressure. High frequency waves from the high frequency power supply 250A and the high frequency power supply 250B are respectively supplied to the inner antenna element 242A and the outer antenna element 242B. A modulated DC voltage from the first power supply 122a or a high frequency bias from the second power supply 122b is supplied to the support structure 118. Accordingly, plasma of the processing gas is generated. In the step ST2 according to an embodiment, the support structure 118 may be set to a non-tilted state. That is, in the step ST2, the support structure 118 is disposed in such a manner that the second axis AX2 coincides with the axis PX. An operation of each unit of the plasma processing apparatus 110 in the step ST2 can be controlled by the control unit Cnt.

In the step ST2, the cap film L4, which is formed from Ru, is etched at a portion exposed from the mask MSK by active species from plasma, for example, active species of hydrogen. As a result, as shown in FIG. 15B, in the whole region of the cap film L4, a portion exposed from the mask MSK is removed.

In the method MT2, a step ST3 is subsequently executed. The step ST3 is an embodiment of a step of etching a magnetic layer, and in the step ST3, the upper magnetic layer L33 of the MTJ layer L3 is etched. The step ST3 of the method MT2 includes a step ST3a and a step ST3b. In the step ST3a and the step ST3b, a processing gas that includes isopropyl alcohol and carbon dioxide is supplied into the processing container 112. The processing gas may further include an inert gas such as an Ar gas. In the step ST3a and the step ST3b, a processing gas is supplied into the processing container 112 from at least one of the first gas supply unit 114a and the second gas supply unit 114b, and the exhaust system 120 operates. Accordingly, a pressure inside the processing container 112, that is, a process pressure is set to a predetermined pressure. High frequency waves from the high frequency power supply 250A and the high frequency power supply 250B are respectively supplied to the inner antenna element 242A and the outer antenna element 242B. A modulated DC voltage from the first power supply 122a or a high frequency bias from the second power supply 122b is supplied to the support structure 118. Accordingly, plasma of the processing gas is generated. Various conditions such as the process pressure, a temperature of the electrostatic chuck, and a partial pressure of isopropyl alcohol in the step ST3 of the method MT2 are set to the same conditions as in the step ST3 of the method MT1.

In the step ST3a, plasma of the processing gas can be generated, and the support structure 118 can be set to a non-tilted state. That is, in the step ST3a, the support structure 118 is disposed in such a manner that the second axis AX2 coincides with the axis PX. Accordingly, the wafer W enters a state of being held horizontally with respect to the vertical direction. In the step ST3a, plasma of the processing gas is generated, isopropyl alcohol and/or a decomposed product thereof, that is, an etchant adheres to a surface of the upper magnetic layer L33, and thus a reaction between the etchant and a magnetic material that configures the upper magnetic layer L33 is promoted. In addition, a reaction product is exhausted. As a result, as shown in FIG. 15C, the upper magnetic layer L33 is etched at a portion exposed from the mask MSK. A deposit that includes carbon derived from isopropyl alcohol is removed by active species of oxygen derived from carbon dioxide. At this time, as shown in FIG. 15C, a deposit DP1, which includes a reaction product and/or carbon derived from isopropyl alcohol adheres to a side surface of the mask MSK, a side surface of the cap film, and a side surface of the upper magnetic layer L33.

Figure 18:
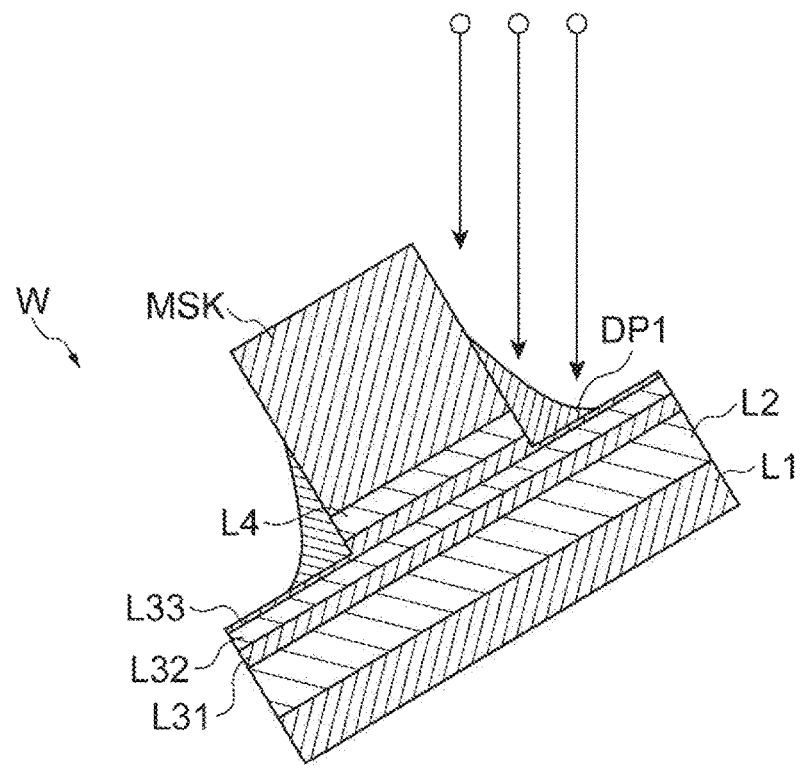
FIG. 18 is a view illustrating a state in which a support structure, on which a wafer W is mounted, is set to a titled condition.

In the subsequent step ST3b, the support structure 118 is set to a tilted state to remove the deposit DP1. That is, the support structure 118 is tilted so that the second axis AX2 is inclined with respect to the axis PX. An angle of the tilt, that is, an angle made by the second axis AX2 and the axis PX can be arbitrarily set, and is an angle that is greater than 0° and not greater than 60° as an example. In the step ST3b, the holding unit 130 rotates around the second axis AX2. The rotational frequency can be arbitrarily set, and is 20 rpm as an example. Accordingly, as shown in FIG. 18, the deposit DP1 is disposed to intersect an attraction direction (indicated by a downward arrow in the drawing) of active species (indicated by a circle in the drawing) such as ions in plasma. Namely, the wafer W is disposed in order for the active species to be incident toward the side surface of the mask MSK, the side surface of the cap film L4, and the side surface of the upper magnetic layer L33. In the step ST3b, since the holding unit 130 rotates, the active species are incident toward the whole region of the side surface of the mask MSK, the side surface of the cap film L4, and the side surface of the upper magnetic layer L33. In addition, the active species are incident in an approximately uniform manner in a plane of the wafer W. As shown in FIG. 15D, it is possible to remove the deposit DP1 in the whole region of the side surface of the mask MSK, the sidesurface of the cap film L4, and the side surface of the upper magnetic layer L33. Accordingly, it is possible to increase verticality of a side surface of a feature that is formed in the cap film L4 and the upper magnetic layer L33. In addition, the verticality is uniformly obtained in the surface of the wafer W.

The step ST3a and the step ST3b may be alternately executed plural times. Accordingly, it is possible to etch the upper magnetic layer L33 while removing the deposit DP1 before a large amount of deposit DP1 is formed.

Figure 16A:
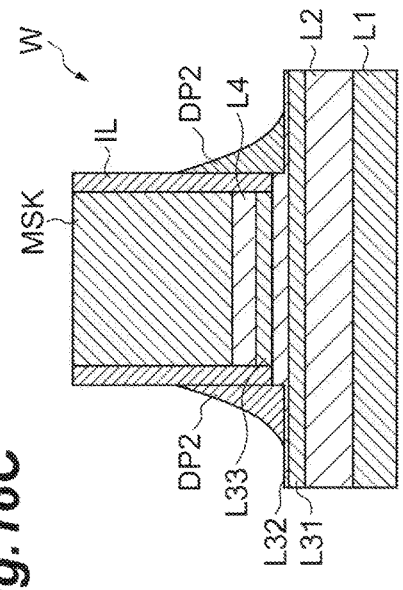
FIGS. 16A, 16B, 16C and 16D are cross-sectional views illustrating products obtained by respective steps of the method MT2 according to the second embodiment.
Figure 16C:
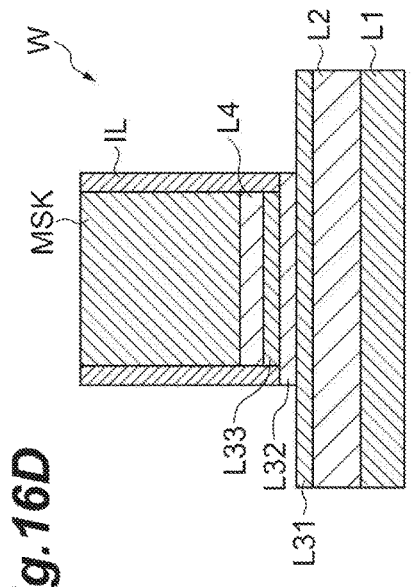
Figure 16B:
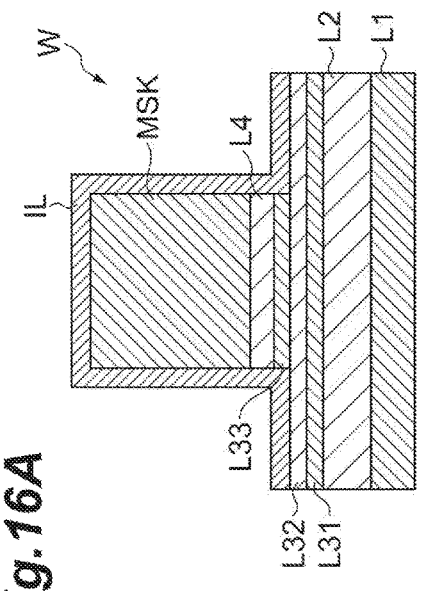

In the method MT2, a step ST4 is subsequently executed. The step ST4 of the method MT2 is almost the same process as the step ST4 of the method MT1, and as shown in FIG. 16A, the insulating film IL is formed on a surface of the wafer W in the film forming apparatus. Subsequently, the insulating film IL is etched in a region conforming to an upper surface of the mask MSK and a region conforming to an upper surface of the insulating layer L32. An arbitrary plasma processing apparatus can be used in the etching. For example, the plasma processing apparatus 110 can be used in the etching. As a result of the etching, as shown in FIG. 16B, the insulating film IL remains along the side surface of the mask MSK, the side surface of the cap film L4, and the side surface of the upper magnetic layer L33.

In the method MT2, a step ST5 is subsequently executed. In the step ST5, the insulating layer L32 of the MTJ layer L3 is etched. An operation and etching conditions of the plasma processing apparatus 110 in the step ST5 may be the same as the operation and etching conditions of the plasma processing apparatus 110 in the step ST3 of the method MT2.

Figure 16D:
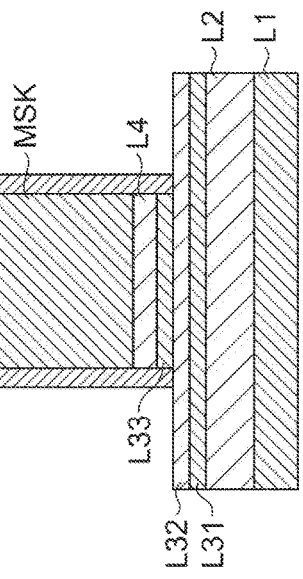

As is the case with the step ST3 of the method MT2, the step ST5 includes a step ST5a in which the support structure 118 is set to a non-tilted state, and a step ST5b in which the support structure 118 is set to a tilted state and the holding unit 130 rotates around the second axis AX2 during generation of plasma of the processing gas. The step ST5a and the step ST5b may be alternately executed plural times. In the step ST5a, the insulating layer L32 is etched. As shown in FIG. 16C, a deposit DP2, which includes a reaction product and/or carbon derived from isopropyl alcohol, adheres to the side surface of the mask MSK, the side surface of the cap film, the side surface of the upper magnetic layer L33, and a side surface of the insulating layer L32. In the subsequent step ST5b, the wafer W is tilted and is rotated, and thus active species in plasma are efficiently incident to the deposit DP2. As a result, as shown in FIG. 16D, the deposit DP2 is removed.

In the method MT2, a step ST6 is subsequently executed. In the step ST6, the lower magnetic layer L31 of the MTJ layer L3 is etched. An operation and etching conditions of the plasma processing apparatus 110 in the step ST6 may be the same as the operation and etching conditions of the plasma processing apparatus 110 in the step ST3 of the method MT2.

Figure 17A:
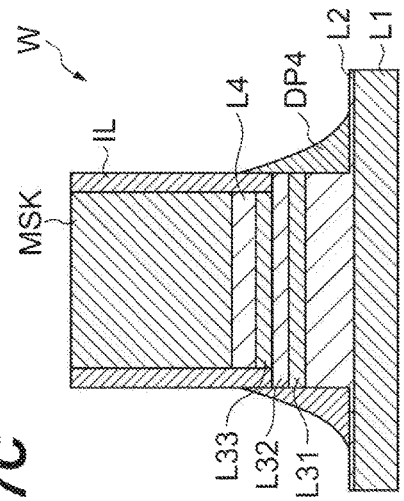
FIGS. 17A, 17B, 17C and 17D are cross-sectional views illustrating products obtained by respective steps of the method MT2 according to the second embodiment.
Figure 17C:
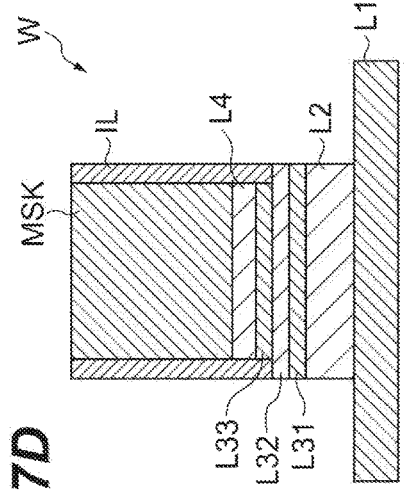
Figure 17B:
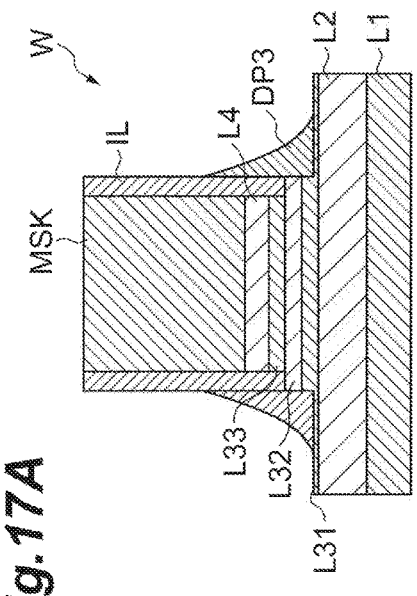

As is the case with the step ST3 of the method MT2, the step ST6 includes a step ST6a in which the support structure 118 is set to a non-tilted state, and a step ST6b in which the support structure 118 is set to a tilted state and the holding unit 130 rotates around the second axis AX2 during generation of plasma of the processing gas. The step ST6a and the step ST6b may be alternately executed plural times. In the step ST6a, the lower magnetic layer L31 is etched. As shown in FIG. 17A, a deposit DP3, which includes a reaction product and/or carbon derived from isopropyl alcohol, adheres to the side surface of the mask MSK, the side surface of the cap film, the side surface of the upper magnetic layer L33, the side surface of the insulating layer L32, and a side surface of the lower magnetic layer L31. In a subsequently step ST6b, the wafer W is tilted and is rotated, and thus active species in plasma are efficiently incident to the deposit DP3. As a result, as shown in FIG. 17B, the deposit DP3 is removed.

In the method MT2, a step ST7 is subsequently executed. In the step ST7, the magnetic film L2 is etched. An operation and etching conditions of the plasma processing apparatus 110 in the step ST7 may be the same as the operation and etching conditions of the plasma processing apparatus 110 in the step ST3 of the method MT2.

Figure 17D:
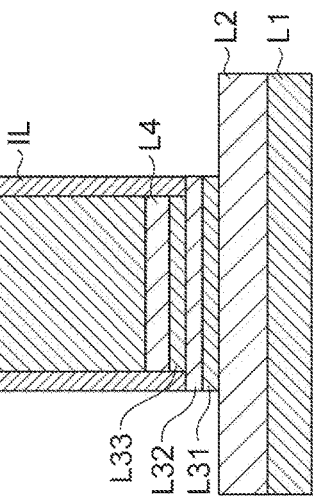

As is the case with the step ST3 of the method MT2, the step ST7 includes a step ST7a in which the support structure 118 is set to a non-tilted state, and a step ST7b in which the support structure 118 is set to a tilted state and the holding unit 130 rotates around the second axis AX2 during generation of plasma of the processing gas. The step ST7a and the step ST7b may be alternately executed plural times. In the step ST7a, the magnetic film L2 is etched. As shown in FIG. 17C, a deposit DP4, which includes a reaction product and/or carbon derived from isopropyl alcohol, adheres to the side surface of the mask MSK, the side surface of the cap film, the side surface of the upper magnetic layer L33, the side surface of the insulating layer L32, the side surface of the lower magnetic layer L31, and a side surface of the magnetic film L2. In a subsequently step ST7b, the wafer W is tilted and is rotated, and thus active species in plasma are efficiently incident to the deposit DP4. As a result, as shown in FIG. 17D, the deposit DP4 is removed.

Third Embodiment

FIG. 19 is a flowchart illustrating an etching method according to a third embodiment. A method MT3 shown in FIG. 19 is executed by using a plasma processing apparatus capable of realizing a state in which the wafer is tilted with respect to a vertical direction and is rotated, such as the plasma processing apparatus 110. However, the method MT3 is different from the method MT2 in that in etching using the plasma processing apparatus, it does not enter a state in which the wafer is horizontally supported, and it enters a state in which the wafer is tilted with respect to the vertical direction and is rotated. Hereinafter, description will be given of the method MT3 with reference to an example in which the plasma processing apparatus 110 is used.

As shown in FIG. 19, in the method MT3, first, in a step ST1, a wafer W shown in FIG. 15A is prepared, and is accommodated in the processing container 12 of the plasma processing apparatus 110. In addition, the wafer W is horizontally mounted on the electrostatic chuck 132 of the holding unit 130.

In the method MT3, a step ST2 is subsequently executed. In the step ST2 of the method MT3, as is the case with the step ST2 of the method MT2, plasma of a processing gas is generated in the processing container 112. As an example, plasma of a processing gas that includes a $H_2$ gas is generated to etch the cap film L4 that is formed from Ru. The processing gas may further include an inert gas such as a $N_2$ gas. In the step ST2, the support structure 118 can be set to a non-tilted state. That is, in the step ST2, the support structure 118 is disposed so that the second axis AX2 coincides with the axis PX.

Subsequently, a step ST30 is executed. The step ST30 is an embodiment of a step of etching a magnetic layer, and in the step ST30, the upper magnetic layer L33 of the MTJ layer L3 is etched. Specifically, in the step ST30 of the method MT3, first, it enters a state in which the wafer W is horizontally mounted on the electrostatic chuck 132 of the holding unit 130. Subsequently, in the step ST30, a processing gas that includes isopropyl alcohol and carbon dioxide is supplied into the processing container 112. The processing gas may further include a rare gas such as an Ar gas. In the step ST30, a processing gas is supplied into the processing container 112 from at least one of the first gas supply unit 114a and the second gas supply unit 114b, and the exhaust system 120 operates. Accordingly, a pressure inside the processing container 112, that is, a process pressure is set to a predetermined pressure.

Subsequently, in the step ST30, a voltage is applied to the electrode film of the electrostatic chuck 132, and thus the wafer W is held by the electrostatic chuck 132. Subsequently, in the step ST30, the support structure 118 is tilted, and the wafer W is held in a tilted state. The support structure 118 is tilted so that the second axis AX2 is inclined with respect to the axis PX. An angle of the tilt, that is, an angle made by the second axis AX2 and the axis PX can be arbitrarily set, and is an angle that is greater than 0° and not greater than 60° as an example. In the step ST30, the holding unit 130 rotates around the second axis AX2. The number of rotations can be arbitrarily set, and is 20 rpm as an example.

Subsequently, in the step ST30, high frequency waves from the high frequency power supply 250A and the high frequency power supply 250B are respectively supplied to the inner antenna element 242A and the outer antenna element 242B. In addition, a modulated DC voltage from the first power supply 122a or a high frequency bias from the second power supply 122b is supplied to the support structure 118. Accordingly, plasma of the processing gas is generated. Various conditions such as a process pressure, a temperature of the electrostatic chuck, and a partial pressure of isopropyl alcohol in the step ST30 of the method MT3 are set to the same conditions as in the step ST3 of the method MT2.

In the step ST30, plasma of the processing gas is generated, isopropyl alcohol and/or a decomposed product thereof, that is, an etchant adheres to a surface of the upper magnetic layer L33, and thus a reaction between the etchant and a magnetic material that configures the upper magnetic layer L33 is promoted. In addition, a reaction product is exhausted. As a result, as shown in FIG. 15D, the upper magnetic layer L33 is etched at a portion exposed from the mask MSK.

In the method MT3, a step ST4 is subsequently executed. The step ST4 of the method MT3 is the same process as the step ST4 of the method MT2, and as shown in FIG. 16A, the insulating film IL is formed on a surface of the wafer W in the film forming apparatus. Subsequently, the insulating film IL is etched in a region conforming to an upper surface of the mask MSK and a region conforming to an upper surface of the insulating layer L32 by using an arbitrary plasma processing apparatus. As a result of the etching, as shown in FIG. 16B, the insulating film IL remains along the side surface of the mask MSK, the side surface of the cap film L4, and the side surface of the upper magnetic layer L33.

Subsequently, a step ST50 is executed. In the step ST50, first, as shown in FIG. 16B, the wafer W is horizontally mounted on the electrostatic chuck 132 of the holding unit 130 in the processing container 112 of the plasma processing apparatus 110. Subsequently, in the step ST50, a processing gas that contains isopropyl alcohol and carbon dioxide is supplied into the processing container 112. The processing gas may further include a rare gas such as an Ar gas. In the step ST50, a processing gas is supplied into the processing container 112 from at least one of the first gas supply unit 114a and the second gas supply unit 114b, and the exhaust system 120 operates. Accordingly, a pressure inside the processing container 112, that is, a process pressure is set to a predetermined pressure.

Subsequently, in the step ST50, a voltage is applied to the electrode film of the electrostatic chuck 132, and thus the wafer W is held by the electrostatic chuck 132. Subsequently, in the step ST50, the support structure 118 is tilted, and the wafer W is held in a tilted state. The support structure 118 is tilted so that the second axis AX2 is inclined with respect to the axis PX. An angle of the tilt, that is, an angle made by the second axis AX2 and the axis PX can be arbitrarily set, and is an angle that is greater than 0° and not greater than 60° as an example. In the step ST50, the holding unit 130 rotates around the second axis AX2. The number of rotations can be set in an arbitrary manner, and is 20 rpm as an example.

Subsequently, in the step ST50, high frequency waves from the high frequency power supply 250A and the high frequency power supply 250B are respectively supplied to the inner antenna element 242A and the outer antenna element 242B. In addition, a modulated DC voltage from the first power supply 122a or a high frequency bias from the second power supply 122b is supplied to the support structure 118. Accordingly, plasma of the processing gas is generated. Various conditions such as a process pressure, a temperature of the electrostatic chuck, and a partial pressure of isopropyl alcohol in the step ST50 of the method MT3 are set to the same conditions as in the step ST5 of the method MT2.

In the step ST50, plasma of the processing gas is generated, isopropyl alcohol and/or a decomposed product thereof, that is, an etchant adheres to a surface of the insulating layer L32, and thus a reaction between the etchant and a magnetic material that constitutes the insulating layer L32 is promoted. In addition, a reaction product is exhausted. As a result, as shown in FIG. 16D, the insulating layer L32 is etched at a portion exposed from the mask MSK.

In the method MT3, a step ST60 and a step ST70 are subsequently executed. In the step ST60 and the step ST70, the same processing gas as the processing gas in the step ST50 is used, and various conditions such as a process pressure, a temperature of the electrostatic chuck, and a partial pressure of isopropyl alcohol in the step ST60 and the step ST70 are set to the same conditions as in the step ST50. Accordingly, in the step ST60 and the step ST70, the tilt and the rotation of the wafer W which are set in the step ST50 are held, and plasma generated in the step ST50 is consecutively used. In the step ST60, as shown in FIG. 17B, the lower magnetic layer L31 of the MTJ layer L3 is etched. In the step ST70, as shown in FIG. 17D, the magnetic film L2 is etched.

Even in the step ST60 and the step ST70, it may be possible that the wafer is horizontally mounted on the electrostatic chuck 132 of the holding unit 130 in the processing container 12 of the plasma processing apparatus 110, the processing gas is subsequently supplied into the processing container 112, the exhaust system 120 operates to set the process pressure to a predetermined pressure, a voltage is then applied to the electrode film of the electrostatic chuck 132 so that the wafer W is held by the electrostatic chuck 132, the wafer W is subsequently tilted and is rotated, high frequency waves from the high frequency power supply 250A and the high frequency power supply 250B are respectively supplied to the inner antenna element 242A and the outer antenna element 242B, and a modulated DC voltage from the first power supply 122a or a high frequency bias from the second power supply 122b is supplied to the support structure 118.

Hereinbefore, various embodiments have been described, but various modification may be made without being limited to the above-described embodiments. The methods in the above-described embodiments relate to manufacturing of the MRAM device including the MTJ layer, but the spirit disclosed in this specification is also applicable to an arbitrary workpiece including a magnetic layer that is formed from a magnetic material.

REFERENCE SIGNS LIST

10: Plasma processing apparatus
12: Processing container
30: Upper electrode
LE: Lower electrode
40: Gas source group
50: Exhaust device
110: Plasma processing apparatus
112: Processing container
114: Gas supply system
114a: First gas supply unit
114b: Second gas supply unit
118: Support structure
132: Electrostatic chuck
PD: Support structure
ESC: Electrostatic chuck
Cnt: Control unit
W: Wafer
L1: Underlying layer
L2: Magnetic film
L3: MTJ layer
L31: Lower magnetic layer
L32: Insulating layer
L33: Upper magnetic layer
L4: Cap film
MSK: Mask

The invention claimed is:

1. A method for etching a magnetic layer, comprising:
   a step of mounting a workpiece on an electrostatic chuck provided in a processing container of a plasma processing apparatus, the workpiece including the magnetic layer; and
   a step of etching the magnetic layer, wherein plasma of a processing gas including isopropyl alcohol and carbon dioxide is generated in the processing container and a temperature of the electrostatic chuck is set to be $-15°$ C. or lower.

2. The method according to claim 1,
   wherein in the step of etching the magnetic layer,
   a pressure of a space in the processing container is set to be 1.333 Pa or less, and
   a partial pressure of the isopropyl alcohol in the processing gas is set to be equal to or lower than a saturation vapor pressure of the isopropyl alcohol at the temperature of the electrostatic chuck.

3. The method according to claim 2,
   wherein in the step of etching the magnetic layer, a partial pressure of the isopropyl alcohol is set to be equal to or lower than a saturation vapor pressure of the isopropyl alcohol, and be equal to or greater than 2% of the saturation vapor pressure.

4. The method according to claim 2,
   wherein in the step of etching the magnetic layer, the temperature of the electrostatic chuck is set to be not higher than $-15°$ C. and not lower than $-50°$ C.

5. The method according to claim 1,
   wherein the workpiece includes an underlying layer, a magnetic film provided on the underlying layer, and a magnetic tunnel junction layer including a lower magnetic layer, a tunnel barrier layer, and an upper magnetic layer, the magnetic tunnel junction layer being provided on the magnetic film, and
   in the step of etching the magnetic layer, the magnetic film and the magnetic tunnel junction layer are etched as the magnetic layer.

6. The method according to claim 1,
   wherein the plasma processing apparatus includes a support structure including the electrostatic chuck,
   the support structure is configured to rotate the electrostatic chuck around a central axis of the electrostatic chuck, and is configured to rotate around a tilt axis perpendicular to the central axis, and
   the step of etching the magnetic layer includes at least one of a step of generating the plasma with the workpiece being supported horizontally with respect to a vertical direction, and a step of generating the plasma with the workpiece being tilted with respect to the vertical direction, and with the workpiece being rotated,
   wherein in the step of etching the magnetic layer, the temperature of the electrostatic chuck is set to be equal to or lower than $-15°$ C. and be equal to or higher than $-50°$ C.

* * * * *